United States Patent
Yoon et al.

(10) Patent No.: US 8,976,587 B2
(45) Date of Patent: *Mar. 10, 2015

(54) DATA STORAGE SYSTEM HAVING MULTI-BIT MEMORY DEVICE AND OPERATING METHOD THEREOF

(71) Applicants: Sangyong Yoon, Seoul (KR); Kitae Park, Seongnam-si (KR); Jinman Han, Seongnam-si (KR); Wonseok Lee, Suwon-si (KR)

(72) Inventors: Sangyong Yoon, Seoul (KR); Kitae Park, Seongnam-si (KR); Jinman Han, Seongnam-si (KR); Wonseok Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/737,140

(22) Filed: Jan. 9, 2013

(65) Prior Publication Data

US 2013/0141972 A1 Jun. 6, 2013

Related U.S. Application Data

(63) Continuation of application No. 13/040,295, filed on Mar. 4, 2011, now Pat. No. 8,355,280.

(30) Foreign Application Priority Data

Mar. 9, 2010 (KR) .................. 10-2010-0020798
Nov. 9, 2010 (KR) .................. 10-2010-0111143

(51) Int. Cl.
*G11C 16/04* (2006.01)
*G11C 16/10* (2006.01)
*G11C 11/56* (2006.01)

(Continued)

(52) U.S. Cl.
CPC ............. *G11C 16/10* (2013.01); *G11C 11/56* (2013.01); *G11C 11/5628* (2013.01); *G11C 16/0483* (2013.01); *G11C 16/26* (2013.01); *G11C 14/0018* (2013.01); *G11C 2211/5641* (2013.01);

(Continued)

(58) Field of Classification Search
USPC ............. 365/185.05, 185.08, 185.18, 185.22, 365/185.25

See application file for complete search history.

(56) References Cited

U.S. PATENT DOCUMENTS 5,930,167 A 7/1999 Lee et al.
7,130,210 B2 10/2006 Bathul et al.

(Continued)

FOREIGN PATENT DOCUMENTS

JP 2006228394 A 8/2006
JP 2007157315 A 6/2007

(Continued)

*Primary Examiner* — Pho M Luu
(74) *Attorney, Agent, or Firm* — Volentine & Whitt, PLLC

(57) ABSTRACT

The operating method of a data storage device includes storing data in a buffer memory according to an external request, and determining whether the data stored in the buffer memory is data accompanying a buffer program operation of a memory cell array. When the data stored in the buffer memory is data accompanying the buffer program operation, the method further includes determining whether a main program operation on the memory cell array is required, and when a main program operation on the memory cell array is required, determining a program pattern of the main program operation on the memory cell array. The method further includes issuing a set of commands for the main program operation on the memory cell array to a multi-bit memory device based on the determined program pattern.

10 Claims, 39 Drawing Sheets

(51) Int. Cl.
*G11C 16/26* (2006.01)
*G11C 14/00* (2006.01)

(52) U.S. Cl.
CPC *G11C 2211/5642* (2013.01); *G11C 2211/5643* (2013.01)
USPC ............ 365/185.05; 365/185.08; 365/185.18; 365/185.22; 365/185.25

(56) References Cited

U.S. PATENT DOCUMENTS

| | | | |
|---|---|---|---|
| 7,257,032 B2 | 8/2007 | Fujiu et al. | |
| 7,391,649 B2 * | 6/2008 | Kang et al. ............... | 365/185.21 |
| 7,936,610 B1 * | 5/2011 | Melcher et al. .......... | 365/185.25 |
| 7,979,667 B2 * | 7/2011 | Allen et al. .................. | 711/203 |
| 8,054,684 B2 | 11/2011 | Gorobets et al. | |
| 8,144,512 B2 * | 3/2012 | Huang et al. .............. | 365/185.03 |
| 8,239,875 B2 * | 8/2012 | Allen et al. .................. | 719/314 |
| 8,315,104 B2 | 11/2012 | Futatsuyama et al. | |
| 8,355,280 B2 * | 1/2013 | Yoon et al. ................ | 365/185.03 |
| 8,369,142 B2 | 2/2013 | Futatsuyama | |
| 2006/0120162 A1 | 6/2006 | Fujiu et al. | |
| 2007/0109854 A1 | 5/2007 | Shibata | |
| 2007/0211530 A1 | 9/2007 | Nakano | |
| 2007/0280000 A1 | 12/2007 | Fujiu et al. | |
| 2007/0285980 A1 | 12/2007 | Shimizu et al. | |
| 2010/0008151 A1 | 1/2010 | Hwang | |
| 2010/0329006 A1 | 12/2010 | Shibata | |
| 2012/0005415 A1 | 1/2012 | Jung et al. | |
| 2012/0170364 A1 | 7/2012 | Jang et al. | |

FOREIGN PATENT DOCUMENTS

| | | |
|---|---|---|
| JP | 2007242163 A | 9/2007 |
| JP | 2007305210 | 11/2007 |
| JP | 2008527611 | 7/2008 |
| KR | 1020060052627 A | 5/2006 |
| KR | 2006228394 | 8/2006 |
| KR | 1020070109885 A | 11/2007 |
| KR | 10-0917690 | 9/2009 |

* cited by examiner

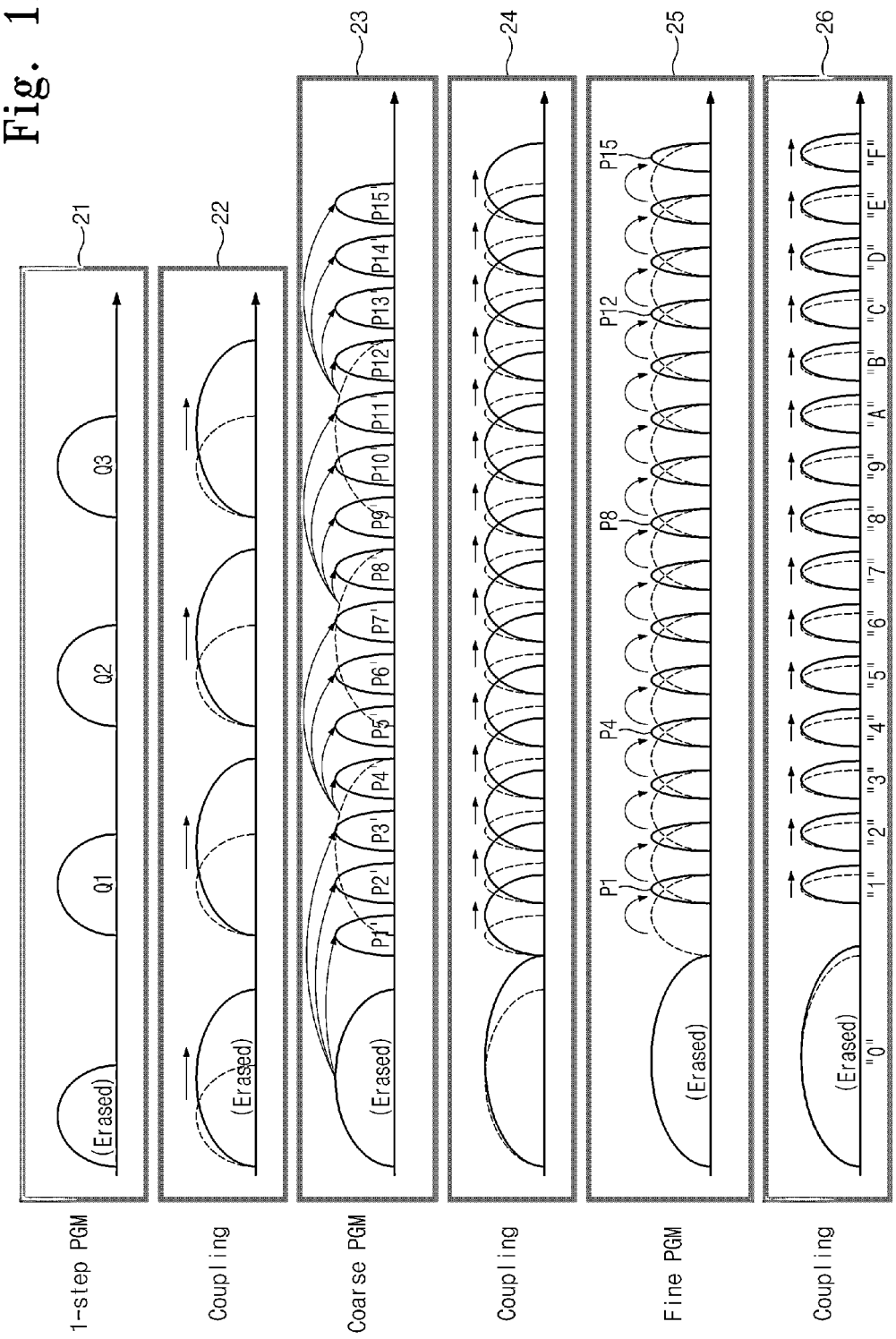

Fig. 3

| WL | 1st | CRS | FIN |
|---|---|---|---|
| 63 | 250,251 | 254,255 | |
| 62 | 246,247 | 252,253 | |
| 61 | 242,243 | 248,249 | |
| ⋮ | ⋮ | ⋮ | ⋮ |
| 3 | 10,11 | 16,17 | |
| 2 | 6,7 | 12,13 | |
| 1 | 2,3 | 8,9 | |
| 0 | 0,1 | 4,5 | |

- 1st: 1st Step (4-Level)
- CRS: Coarse PGM (16-Level)
- FIN: Fine PGM (16-Level)

Fig. 9

| WL | 1st | CRS | FIN |
|---|---|---|---|
| 63 | 188,189 | 191 | |
| 62 | 185,186 | 190 | |
| 61 | 182,183 | 187 | |
| ⋮ | ⋮ | ⋮ | ⋮ |
| 3 | 8,9 | 13 | |
| 2 | 5,6 | 10 | |
| 1 | 2,3 | 7 | |
| 0 | 0,1 | 4 | |

- 1st: 1st Step(4-Level)
- CRS: Coarse PGM
- FIN: Fine PGM

Fig. 13

| WL | 1st | CRS | FIN |
|---|---|---|---|
| 63 | 186,189 | 191 | |
| 62 | 183,187 | 190 | |
| 61 | 180,184 | 188 | |
| ⋮ | ⋮ | ⋮ | ⋮ |
| 3 | 6,10 | 14 | |
| 2 | 3,7 | 11 | |
| 1 | 1,4 | 8 | |
| 0 | 0,2 | 5 | |

- 1st: 1st Step (4-Level)
- CRS: Coarse PGM (8-Level)
- FIN: Fine PGM (8-Level)

Fig. 21

| WL | 1st | CRS | FIN |
|---|---|---|---|
| 63 | 246,250 | 253,255 | |
| 62 | 242,247 | 251,254 | ↘ |
| 61 | 238,243 | 248,252 | ↘ |
| 60 | 234,239 | 244,249 | ↘ |
| 59 | 230,235 | 240,245 | ↘ |
| 58 | 226,231 | 236,241 | ↘ |
| ⋮ | ⋮ | ⋮ | ⋮ |
| 5 | 14,19 | 24,29 | |
| 4 | 10,15 | 20,25 | ↘ |
| 3 | 6,11 | 16,21 | ↘ |
| 2 | 3,7 | 12,17 | ↘ |
| 1 | 1,4 | 8,13 | ↘ |
| 0 | 0,2 | 5,9 | ↘ |

- 1st: 1st Step (4-Level)
- CRS: Coarse PGM (16-Level)
- FIN: Fine PGM (16-Level)

DATA STORAGE SYSTEM HAVING MULTI-BIT MEMORY DEVICE AND OPERATING METHOD THEREOF

CROSS-REFERENCE TO RELATED APPLICATION

This is a Continuation of Application Ser. No. 13/040,295, filed Mar. 4, 2011, which issued as U.S. Pat. No. 8,355,280, on Jan. 15, 2013, and in which a claim of priority under 35 U.S.C §119 is made to Korean Patent Applications No. 10-2010-0020798, filed Mar. 9, 2010, and No. 10-2010-0111143, filed Nov. 9, 2010, the entireties of which are incorporated by reference herein.

BACKGROUND

Exemplary embodiments relate to an electronic device, and more particularly, exemplary embodiments relate to a memory system.

Semiconductor memory devices are a vital microelectronic component commonly found in digital logic systems, such as computers, and microprocessor-based applications ranging from satellites to consumer electronics. Advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices, and nonvolatile memory devices. In RAM devices, data is stored, for example, by either establishing the logic state of a bistable flip-flop such as in a static random access memory (SRAM), or by charging a capacitor in a dynamic random access memory (DRAM). In both SRAM and DRAM devices, data remains stored and may be read as long as power is supplied, but data is lost when the power is turned off or interrupted.

Mask read-only memory (MROM), programmable read-only memory (PROM), erasable programmable read-only memory (EPROM), and electrically erasable programmable read-only memory (EEPROM) devices are examples of non-volatile memories which are capable of retaining stored data even when power is turned off or otherwise interrupted. The non-volatile memory data storage state may be permanent or reprogrammable, depending upon the fabrication technology utilized. Non-volatile semiconductor memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvRAM) for use in systems that require fast, reprogrammable non-volatile memory. In addition, dozens of special memory architectures have evolved which contain some additional logic circuitry to optimize performance for application-specific tasks.

Mask read-only memory (MROM), programmable read-only memory (PROM) and erasable programmable read-only memory (EPROM) nonvolatile memory devices are not freely capable of executing self-system erase and write operations, so it is not easy to update the contents of such memories. On the other hand, electrically erasable programmable read-only memory (EEPROM) nonvolatile memory devices are electrically erasable and writable, and may, thus, be readily applied to auxiliary memories or system programming memories that require continuous update.

SUMMARY

One aspect of embodiments of the inventive concepts is directed to an operating method provided for a data storage device including a non-volatile memory device which includes a memory cell array; and a memory controller which includes a buffer memory and which controls the non-volatile memory device. The operating method includes storing data in the buffer memory according to an external request, and determining whether the data stored in the buffer memory is data accompanying a buffer program operation of the memory cell array. When the data stored in the buffer memory is data accompanying the buffer program operation, a determination is made as to whether a main program operation on the memory cell array is required, and when a main program operation on the memory cell array is required, a program pattern of the main program operation on the memory cell array is determined. The operating method further includes issuing a set of commands for the main program operation on the memory cell array to the multi-bit memory device, based on the determined program pattern.

Another aspect of embodiments of the inventive concept is directed to an operating method provided for a data storage device including a non-volatile memory device which includes a memory cell array; and a memory controller which includes a buffer memory and which controls the non-volatile memory device. The operating method includes storing data in the buffer memory according to an external request, determining a program pattern on the memory cell array based on address information associated with data stored in the buffer memory, and issuing a set of commands to the multi-bit memory device based on the determined program pattern. The determined program pattern is used to determine either one of a command sequence for a buffer program operation on the memory cell array and a command sequence for buffer and main program operations on the memory cell array.

Still another aspect of embodiments of the inventive concepts is directed to a data storage device which includes a non-volatile memory device including a memory cell array which includes a first region and a second region, and a memory controller including a buffer memory and configured to control the non-volatile memory device. When data of a minimum program unit of the first region is stored in the buffer memory, the memory controller controls the non-volatile memory device such that data stored in the buffer memory is stored in the first region. When data of a minimum program unit of the second region is stored in the first region, the memory controller controls the non-volatile memory device such that data stored in the first region is stored in the second region. The non-volatile memory device comprises page buffers each including plural latches, one of the plural latches being used to store data to be stored in or read out from the first region, and data stored in the one latch being dumped into a selected latch among the remaining latches according to a dump command provided from the memory controller when data stored in the first region is stored in the second region.

Another aspect of embodiments of the inventive concepts is directed to an operating method provided for a data storage device including a non-volatile memory device which includes a memory cell array; and a memory controller which includes a buffer memory and which controls the non-volatile memory device. The operating method includes controlling the non-volatile memory device so as to perform a buffer program operation on a first region of the memory cell array in response to a requirement for the buffer program operation on the first region of the memory cell array, and controlling the non-volatile memory device so as to perform a main program operation on a second region of the memory cell array in response to a requirement for the main program operation on the second region of the memory cell array. The main program operation on the second region includes a plurality of data setup periods, each accompanying a single-bit read operation on the first region, and a multi-bit program period in which results of single-bit read operations executed in the plurality of data setup operations are stored in the second region. An operating mode of the non-volatile memory device is switched prior to a start of the plurality of data setup periods and following an end of the plurality of data setup periods.

Yet another aspect of embodiments of the inventive concepts is directed to a non-volatile memory device which includes a memory cell array, and page buffers configured to read data from the memory cell array and to write data in the memory cell array. The memory cell array includes a first region programmed via a buffer program operation and a second region programmed via a main program operation, data programmed in the first region via the buffer program operation being programmed in the second region via the main program operation. Each of the page buffers includes plural latches, at least one of the plural latches being used to store data read from the first region at the main program operation, and data stored in the at least one latch being dumped into a selected latch among the remaining latches according to an input of a dump command at the main program operation.

Still another aspect of embodiments of the inventive concepts is directed to a data storage system which includes a non-volatile memory device including a memory cell array divided into a first region and a second region, and a memory controller including a buffer memory and configured to control the non-volatile memory device. When data of a minimum program unit of the first region is stored in the buffer memory, the memory controller controls the non-volatile memory device to store data of the buffer memory in the first region.

Another aspect of embodiments of the inventive concepts is directed to an operating method is provided for a data storage system which includes a non-volatile memory device; and a memory controller including a buffer memory. The operating method includes determining whether data of a first minimum program unit is stored in the buffer memory, and, when data of the first minimum program unit is stored in the buffer memory, storing data of the first minimum program unit in a first region of the non-volatile memory device. The operating method further includes determining whether data of a second minimum program unit which is different from the first minimum program unit is stored in the first region, and, when data of the second minimum program unit is stored in the first region, performing a multi-bit program operation of a second region of the non-volatile memory device based on data of the second minimum program unit stored in the first region.

BRIEF DESCRIPTION OF THE FIGURES

The above and other objects and features will become apparent from the detailed description with reference to the accompanying figures, wherein like reference numerals refer to like parts throughout the various figures unless otherwise specified, and wherein:

FIG. 1B is a diagram showing examples of threshold voltage distributions that are varied when a program operation is carried out according to 3-step programming used to store 4-bit data in each memory cell;

FIG. 3 is a diagram showing an exemplary address scramble technique of a multi-bit memory device which stores 4-bit data per cell and to which a 3-step reprogram method is applied;

FIG. 9 is a diagram showing an exemplary address scramble technique of a multi-bit memory device which stores 3-bit data per cell and to which a 3-step reprogram method is applied;

FIG. 13 is a diagram showing an exemplary address scramble technique of a multi-bit memory device which stores 3-bit data per cell and to which a 3-step reprogram method is applied;

FIG. 21 is a diagram showing another exemplary address scramble technique of a multi-bit memory device in which 4-bit data is stored in a memory cell and a reprogram method is used;

DETAILED DESCRIPTION

Figure 1A:
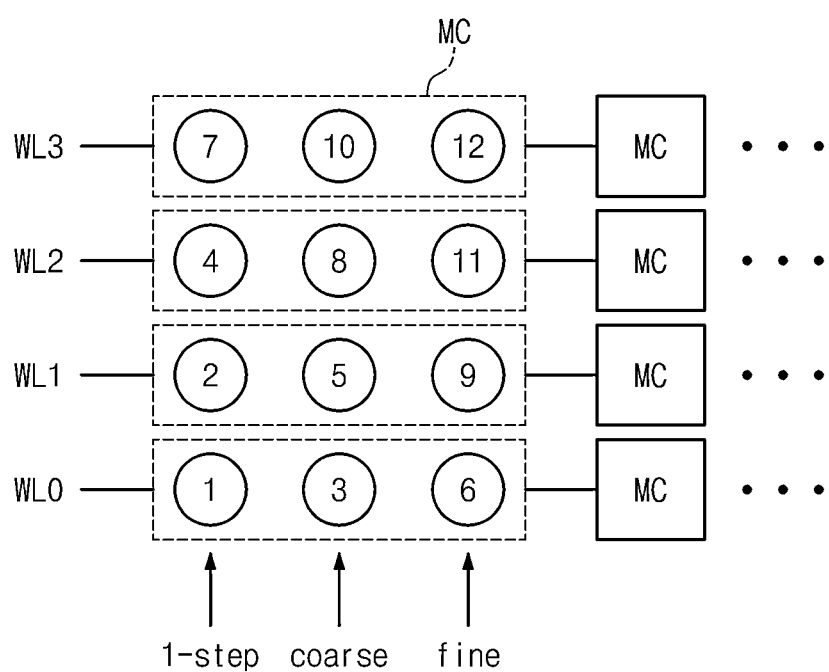
FIG. 1A a diagram showing an example of an address scramble technique applied to a multi-level memory device according to an exemplary embodiment of the inventive concepts.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Herein, a multi-level memory device refers a memory device capable of storing multiple bits per memory cell. As the number of data bits stored in each memory cell of multi-level memory devices has increased, it has become increasingly difficult to secure the reliability of such devices. A representative one of factors causing degradation in reliability is the potential for a variation of threshold voltages to result from coupling between adjacent memory cells. For example, a threshold voltage of a previously programmed memory cell may be varied due to coupling caused when a memory cell adjacent to the previously programmed memory cell is programmed. In FIG. 1A, there is illustrated an example of an address scramble technique applied to a multi-level memory device in order to effectively manage such coupling.

An address scramble technique will be described under the assumption that 4-bit data is stored in one memory cell. For ease of illustration, in FIG. 1A, there are illustrated only four word lines WL0 to WL3. A plurality of memory cells MC is connected with each word line. Initially, a 1-step program operation is performed in which lower 2-bit data is stored to each memory cell in the first word line WL0. That is, during the 1-step program operation, 2-page data is stored in the memory cells connected with the first word line WL0. This is represented by ① in FIG. 1A. Then, a 1-step program operation is executed with respect to memory cells connected with the second word line WL1. This is represented by ② in FIG. 1A. After the 1-step program operation is performed with respect to memory cells connected with the second word line WL1, a coarse program operation (also called a 2-step program operation) is executed with respect to the first word line WL0 which is placed below the second word line WL1 and in which lower 2-bit data is programmed. This is represented by ③ in FIG. 1A. During the coarse program operation, upper 2-bit data is stored in memory cells connected with the first word line WL0. Following the coarse program operation of memory cells connected with the first word line WL0, the 1-step program operation is executed with respect to the third word line WL2. This is represented by ④ in FIG. 1A. After the 1-step program operation for the third word line WL2, the coarse program operation is executed during which upper 2-bit data is stored in memory cells connected with the second word line WL1. This is represented by ⑤ in FIG. 1A. Following the coarse program operation for the second word line WL1, a fine program operation is executed with respect to the first word line WL0. This is represented by ⑥ in FIG. 1A. Thereafter, the 1-step, coarse, and fine program operations are sequentially executed according to the above-described program order as shown by the circled-numbers of FIG. 1A. The manner in which word lines are selected according to the program order described in FIG. 1A is referred to as an address scramble technique.

When the 1-step program operation and the coarse program operation are completed, threshold voltage distributions (for example, $2^M$ threshold voltage distributions) corresponding to M-bit data (M being an integer of 2 or more) are formed. Although all these threshold voltage distributions are formed upon completion of the coarse program operation, read margins between threshold voltage distributions are generally insufficient. The fine program operation thus is carried out to secure read margins sufficient to distinguish threshold voltage distributions. In other words, the fine program operation is made to narrow a width of each threshold voltage distribution, and thus increase a spacing between adjacent distributions. During the fine program operation, read verify voltages are used which are higher than read verify voltages used during the coarse program operation. It is possible to reduce the coupling between adjacent memory cells through the above-described program technique, which is called a reprogram method/algorithm.

In an exemplary embodiment, the above-described reprogram method for 4-bit data, that is, the 1-step programming, coarse programming, and fine programming may be applied to a reprogram method of 2-bit data and 3-bit data.

With the reprogram method, it is necessary to retain data stored in memory cells in an arbitrary word line until the fine program operation for the arbitrary word line is completed. For example, the 1-step program operation is carried out depending upon data provided to a multi-bit memory device from a memory controller, and the coarse program operation is executed depending upon data stored through the 1-step program operation and data provided from the memory controller. The fine program operation is made depending upon data stored through the 1-step and coarse program operations. However, as described above, it is difficult to exactly read data stored through the 1-step and coarse program operations. This means that data necessary for the fine program operation must be provided to the multi-bit memory device from the memory controller. For this reason, the memory controller necessitates retaining data stored in memory cells in an arbitrary word line until the fine program operation for the arbitrary word line is completed. This necessitates the provision of a relatively large buffer memory in the memory controller in order to retain data needed for the fine program operation.

FIG. 1B is a diagram showing a variation in threshold voltage distributions as a program operation is carried out according to 3-step programming to store 4-bit data in each memory cell. By way of example, FIG. 1B illustrates threshold voltage distributions of memory cells of word line WL0 in FIG. 1A during the 3-step programming.

Firstly, 2-page data (that is, the first and second page data) is stored in memory cells of a selected word line (for example, WL0 in FIG. 1A). At this time, as illustrated in box 21 of FIG. 1B, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (for example, WL0) occurs after a 1-step program operation of memory cells in an adjacent word line (for example, WL1). At this time, as illustrated in a box 22 of FIG. 1B, distributions of 1-step programmed memory cells in the word line (for example, WL0) widen due to the coupling caused when memory cells in an adjacent word line (for example, WL1) are programmed.

Then, 2-page data, that is, the third and fourth page data may be stored in memory cells of the selected word line WL0. At this time, as illustrated in a box 23 of FIG. 1B, memory cells in a threshold voltage distribution corresponding to each state may be programmed to have threshold voltages in corresponding threshold voltage distributions P1'~P15'. For example, memory cells in a threshold voltage distribution corresponding to an erase state E may be programmed to have threshold voltages in corresponding threshold voltage distributions to program states P1' to P3', based on data to be programmed. Memory cells in a threshold voltage distribution corresponding to a program state Q1 may be programmed to have threshold voltages in corresponding threshold voltage distributions to program states P4' to P7', based on data to be programmed. Memory cells in a threshold voltage distribution corresponding to a program state Q2 may be programmed to have threshold voltages in corresponding threshold voltage distributions to program states P8' to P11', based on data to be programmed. Memory cells in a threshold voltage distribution corresponding to a program state Q3 may be programmed to have threshold voltages in corresponding threshold voltage distributions to program states P12' to P15', based on data to be programmed.

As described above, a fine program operation of coarse programmed memory cells in a word line (for example, WL0)

may be made after a 1-step program operation and a coarse program operation on adjacent word lines (for example, WL2 and WL1). At this time, as illustrated by a box 24 of FIG. 1B, distributions of coarse programmed memory cells in the word line (for example, WL0) widen due to the coupling caused when memory cells in adjacent word lines (for example, WL2 and WL1) are programmed. For this reason, it is difficult to reliably read data from coarse programmed memory cells.

Memory cells in the word line WL0 may be programmed to have final threshold voltage distributions P1 to P15 as illustrated in a box 25 of FIG. 1B. This operation is called a fine program operation. As described above, the fine program operation necessitates previously programmed data (for example, the first to fourth page data). Since it is difficult to read previously programmed data from memory cells in the word line WL0, the fine program operation will be made based on data provided from a memory controller (or, data maintained by a memory device). As illustrated in a box 26 of FIG. 1B, distributions of fine programmed memory cells widen due to the coupling caused when memory cells in adjacent word lines are programmed.

Afterwards, a 1-step program operation, a coarse program operation, and a fine program operation on each word line will be made according to a program order (or, sequence) described in FIG. 1A, which will be executed in the same manner as described in FIG. 1B.

Figure 1C:
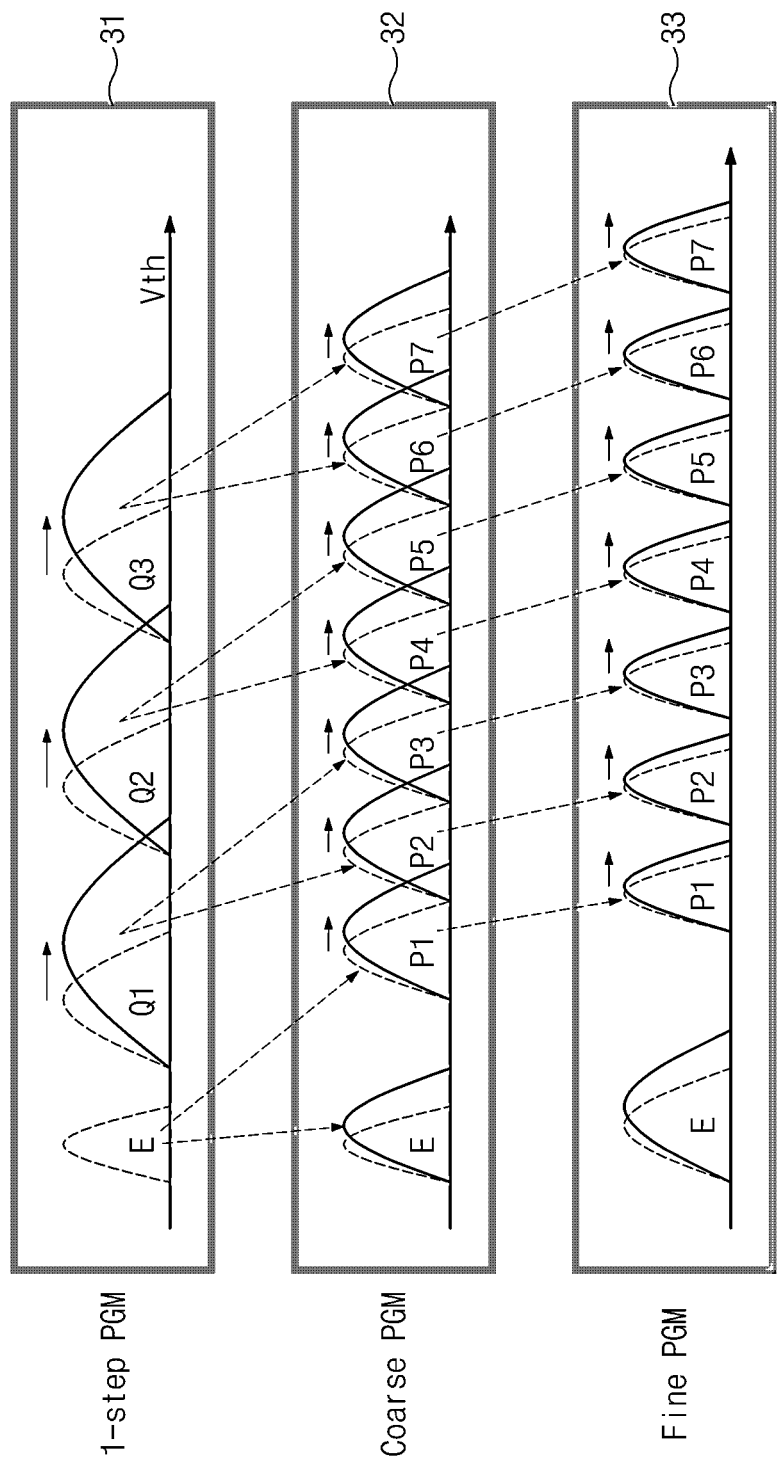
FIG. 1C is a diagram showing examples of threshold voltage distributions that are varied when a program operation is carried out according to 3-step programming used to store 3-bit data in each memory cell.

FIG. 1C is a diagram showing a variation in threshold voltage distributions when a program operation is carried out according to 3-step programming to store 3-bit data in each memory cell. A program method according to the 3-step programming will be more fully described below.

Firstly, 2-page data (that is, the first and second page data) is stored in memory cells of a selected word line (for example, WL0 in FIG. 1A). At this time, as illustrated in a box 31 of FIG. 1C, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (for example, WL0) occurs after a 1-step program operation of memory cells in an adjacent word line (for example, WL1). At this time, as illustrated by a solid line of a box 31 of FIG. 1C, distributions of 1-step programmed memory cells in the word line (for example, WL0) widen due to the coupling caused when memory cells in an adjacent word line (for example, WL1) are programmed.

Then, 1-page data may be stored in memory cells of the selected word line WL0. At this time, as illustrated in a box 32 of FIG. 1C, memory cells in a threshold voltage distribution corresponding to each state may be programmed to have threshold voltages in corresponding threshold voltage distributions P1~P7. For example, memory cells in a threshold voltage distribution corresponding to an erase state E may be programmed to have threshold voltages in a corresponding threshold voltage distribution to a program state P1, based on data to be programmed. Memory cells in a threshold voltage distribution corresponding to a program state Q1 may be programmed to have threshold voltages in corresponding threshold voltage distributions to program states P2 and P3, based on data to be programmed. Memory cells in a threshold voltage distribution corresponding to a program state Q2 may be programmed to have threshold voltages in corresponding threshold voltage distributions to program states P4 and P5, based on data to be programmed. Memory cells in a threshold voltage distribution corresponding to a program state Q3 may be programmed to have threshold voltages in corresponding threshold voltage distributions to program states P6 to P7, based on data to be programmed.

As described above, a fine program operation of coarse programmed memory cells in a word line (for example, WL0) may be executed after a 1-step program operation and a coarse program operation on adjacent word lines (for example, WL2 and WL1). At this time, as illustrated by a solid line in a box 32 of FIG. 1C, distributions of coarse programmed memory cells in the word line (for example, WL0) widen due to the coupling caused when memory cells in adjacent word lines (for example, WL2 and WL1) are programmed. For this reason, it is difficult to exactly read data from coarse programmed memory cells.

Memory cells in the word line WL0 may be programmed to have final threshold voltage distributions P1 to P15 as illustrated in a box 33 of FIG. 1C. This operation is called a fine program operation. As described above, the fine program operation necessitates previously programmed data (for example, the first to third page data). Since it is difficult to read previously programmed data from memory cells in the word line WL0, the fine program operation will be made based on data provided from a memory controller (or, data maintained by a memory device). As illustrated by a solid line in a box 33 of FIG. 1C, distributions of fine programmed memory cells widen due to the coupling caused when memory cells in adjacent word lines are programmed.

Afterwards, a 1-step program operation, a coarse program operation, and a fine program operation on each word line will be carried out according to a program order (or, sequence) described in FIG. 1A, which will be executed in the same manner as described in FIG. 1C.

Figure 2:
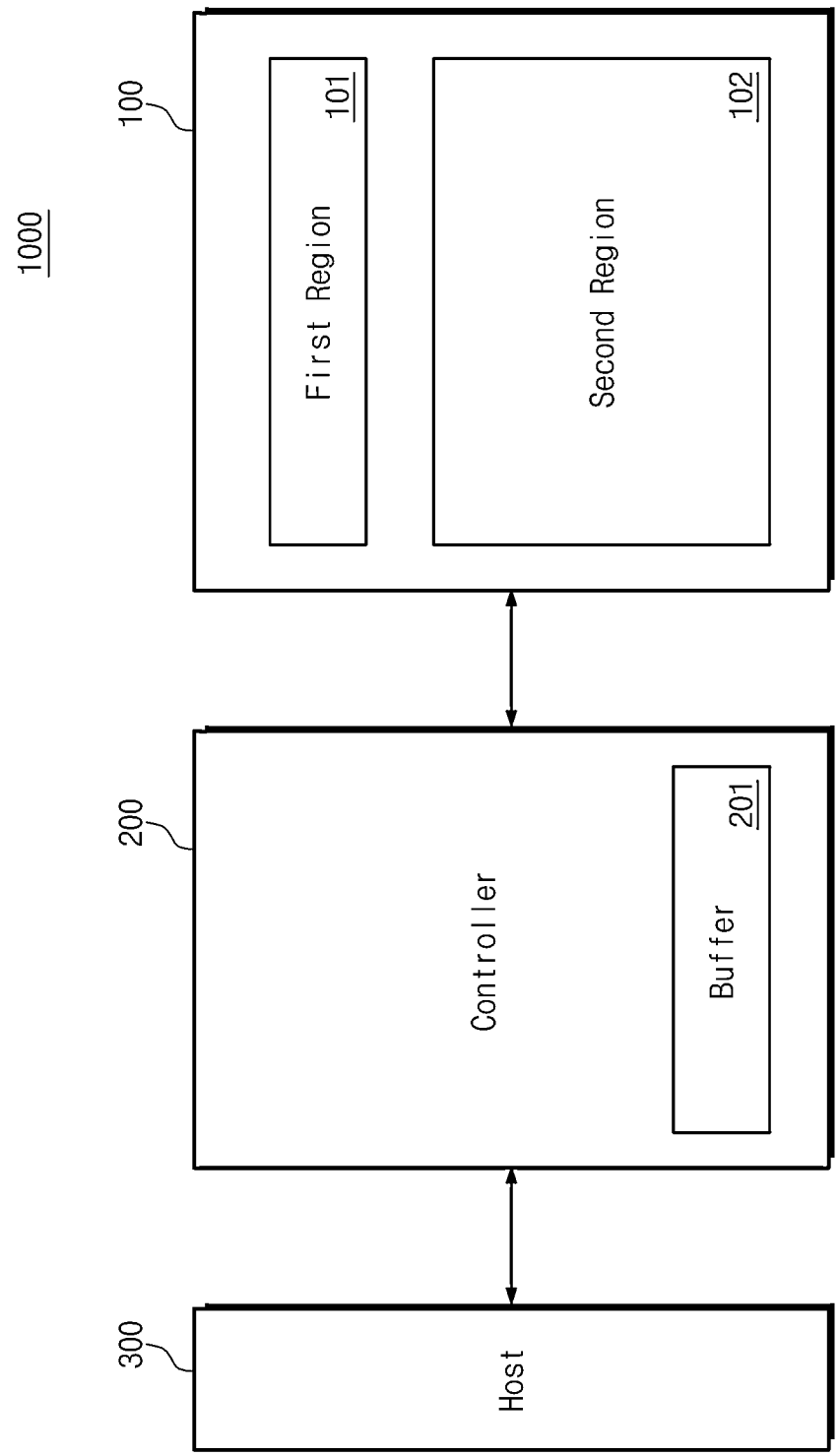
FIG. 2 is a block diagram showing a data storage system according to an exemplary embodiment of the inventive concepts.

FIG. 2 is a block diagram showing a data storage system according to an exemplary embodiment of the inventive concepts.

Referring to FIG. 2, a data storage system 1000 includes a multi-bit memory device 100 as a non-volatile memory device, a memory controller 200, and a host 300. The multi-bit memory device 100 may be formed of one or more memory chips. As a data storage device, the multi-bit memory device 100 and the memory controller 200 may constitute a memory card, a Solid State Drive (SSD), a memory stick, or the like. The multi-bit memory device 100 includes a plurality of memory blocks (or, sectors/banks), each of which has memory cells arranged in rows and columns. Each of the memory cells stores multi-bit (or multi-level) data. The memory cells are arranged to have the 2-dimensional array structure or a 3-dimensional/vertical array structure. An exemplary 3-dimensional array structure is disclosed in U.S. Publication Nos. 2008/0023747 and 2008/0084729, the entireties of which are incorporated by reference herein.

Memory blocks of the multi-bit memory device 100 are divided into a first region 101 and a second region 102. Herein, the first and second regions 101 and 102 may be logically defined, rather than physically defined. Further, the division of first and second regions 101 and 102 can be changed logically. Memory blocks in the first region 101 are programmed in a manner different from memory blocks in the second region 102. For example, memory blocks in the first region 101 may be programmed according to a single-bit program technique (hereinafter, referred to as an SLC program technique), and memory blocks in the second region 102 may be programmed according to a multi-bit program manner (for example, the above-described N-step reprogram technique) (hereinafter, referred to as an MLC program technique). In other words, according to this example, each memory cell in the first region 101 stores 1-bit data, while each memory cell in the second region 102 stores M-bit data (M being an integer of 3 or more). Further, each memory cell in the first region 101 may store less data bits in number as compared with M-bit data (M being an integer of 3 or more) stored in each memory cell in the second region 102.

Still referring to FIG. 2, the memory controller 200 is configured to control the multi-bit memory device 100 in response to a request of the host 300. The memory controller 200 may include a buffer memory 201. The buffer memory 201 is used to temporarily store data sent from the host 300 and data read out from the multi-bit memory device 100. The memory controller 200 controls a program operation of the memory device 100 in a static scheduling mode. For example, when data of a minimum program unit for the first region 101 is stored in the buffer memory 201, the memory controller 200 controls the multi-bit memory device 100 such that data of the minimum program unit is stored (or, programmed) in the first region 101. This is called a buffer program operation. If data of the minimum program unit for the second region 102 is gathered at the first region 101, the memory controller 200 controls the multi-bit memory device 100 such that data of the minimum program unit for the second region 102 is stored (or, programmed) in the second region 102. This is called a main program operation. The buffer program operation and the main program operation will be more fully described later.

In an exemplary embodiment, the minimum program unit for the first region 101 and the minimum program unit for the second region 102 may be variously determined depending upon a program mode, a cell-per-bit number, and the like. The minimum program unit for the first region 101 is different from the minimum program unit for the second region 102.

In an exemplary embodiment, it is possible to reduce a size of the buffer memory 201 of the memory controller 200 by storing data in the first region 101 through the buffer program operation and storing data in the second region 102 through the main program operation. In other words, it is unnecessary to retain data for a fine program operation in the buffer memory 201. Accordingly, a size of the buffer memory 201 of the memory controller 200 is reduced.

Figure 4:
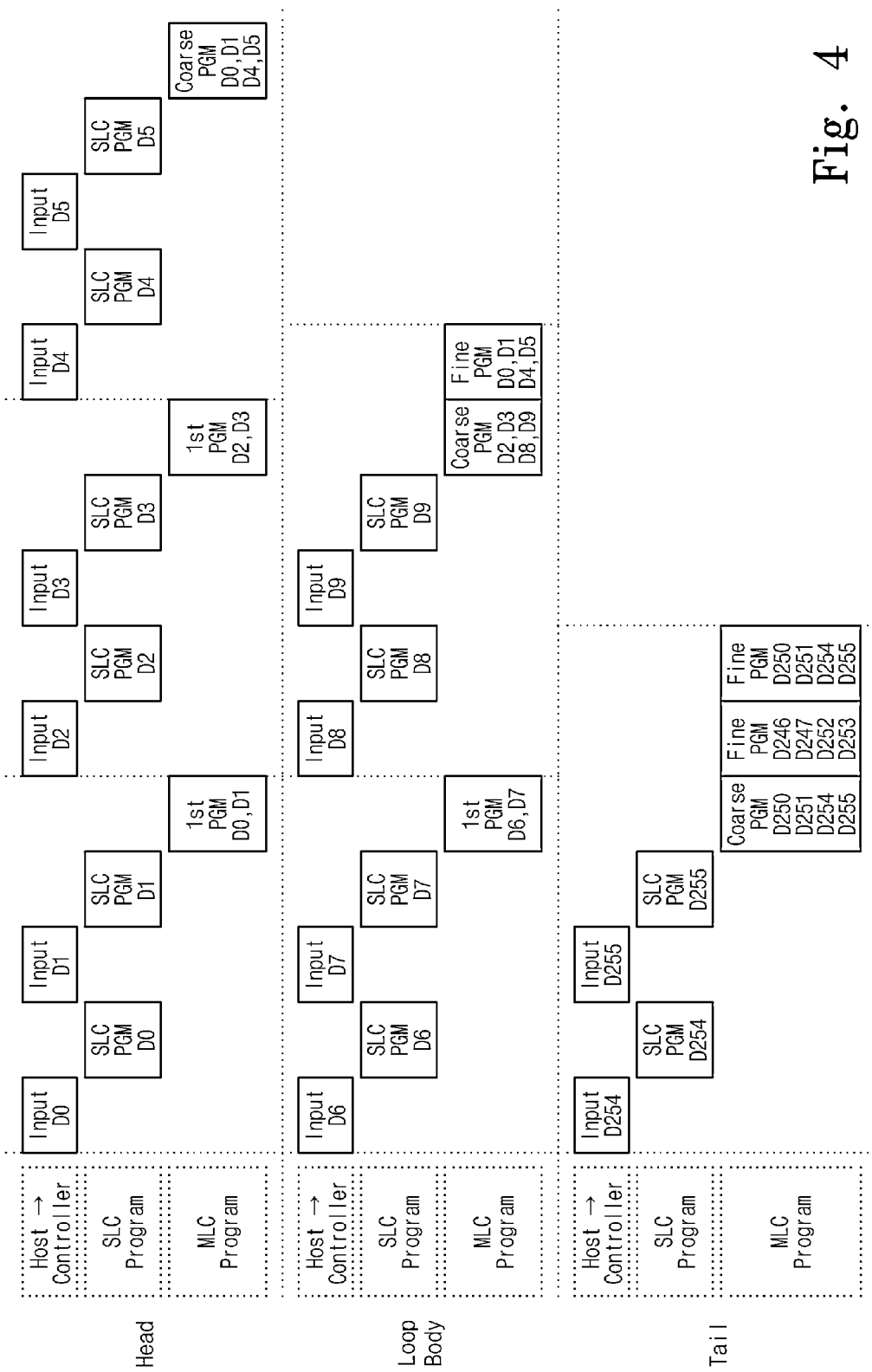
FIG. 4 is a diagram showing an exemplary data flow during a program operation of a data storage system illustrated in FIG. 2.

FIG. 3 is a diagram showing an exemplary address scramble technique of a multi-bit memory device which stores 4-bit data per cell and to which a 3-step reprogram method is applied, and FIG. 4 is a diagram showing an example of a data flow during a program operation of a data storage system illustrated in FIG. 2. An operation of a data storage system according to an exemplary embodiment of the inventive concepts will be more fully described below.

In order to simplify the description, as illustrated in FIG. 3, it is assumed that each memory block includes 64 word lines WL0 to WL63 and that each memory cell stores 4-bit data. With this assumption, 4 pages are stored in the memory cells of each word line, and 256 pages are stored in each memory block. Herein, a term "page" is used to indicate a page of data which, for example, is logically addressable by a separate page address.

First, when data D0 of the minimum program unit for the first region 101 is transferred to a buffer memory 201 of a memory controller 200 from a host 300, the data D0 stored in the buffer memory 201 is programmed in the first region 101 of the multi-bit memory device 100 according to control of the memory controller 200. As described above, the data D0 is programmed in the first region 101 through an SLC program operation. The memory controller 200 judges whether data of the minimum program unit for the second region 102 is gathered at the first region 101, and controls a main program operation according to the judgment result. Whether data of the minimum program unit for the second region 102 is gathered at the first region 101 may be judged according to a page address. Since only one page D0 is stored in the first region 101, the main program operation is not carried out. If data D1 of the minimum program unit for the first region 101 is transferred to the buffer memory 201 of the memory controller 200 from the host 300, the data D1 stored in the buffer memory 201 is programmed in the first region 101 of the multi-bit memory device 100 according to control of the memory controller 200. Since data of the minimum program unit for the second region 102 (for example, 2-page necessary for a 1-step program operation) is gathered at the first region 101, the memory controller 200 controls the multi-bit memory device 100 such that data D0 and D1 stored in the first region 101 is stored in the second region 102. That is, the 1-step program operation for a word line WL0 is made based on the data D0 and D1 stored in the first region 101.

As described above, when data Di (i being 0 to 255) of the minimum program unit for the first region 101 is stored in the buffer memory 201, data stored in the buffer memory 201 is programmed in the first region 101 of the multi-bit memory device 100 through the SLC program operation under control of the memory controller 200. Together with a determination as to whether data of the minimum program unit for the first region 101 is stored in the buffer memory 201, the memory controller 200 determines whether data of the minimum program unit for the second region 102 is gathered at the first region 101. The memory controller 200 may control the 1-step program operation, the coarse program operation, or the fine program operation for the second region 102, depending upon the determination result, which will be more fully described below.

The 1-step program operation, the coarse program operation, or the fine program operation for the second region 102 may be executed in an address scramble manner as described in connection with FIG. 3. For example, in the event that D0 and D1 data is stored in the first region 101, the 1-step program operation for a word line WL0 is carried out depending upon the D0 and D1 data stored in the first region 101. If D2 and D3 data is stored in the first region 101, the 1-step program operation for a word line WL1 is carried out. That is, the 1-step program operation for the word line WL1 is carried out depending upon the D2 and D3 data stored in the first region 101.

Continuously, if D4 and D5 data is stored in the first region 101, the coarse program operation for the word line WL0 is carried out depending upon the D0, D1, D4 and D5 data stored in the first region 101. When D6 and D7 data is stored in the first region 101, the 1-step program operation for the word line WL2 is carried out depending upon the D6 and D7 data stored in the first region 101. In the event that D8 and D9 data is stored in the first region 101, the coarse program operation for the word line WL1 is carried out depending upon the D2, D3, D8 and D9 data stored in the first region 101. After the coarse program operation for the word line WL1 is carried out depending upon the D8 and D9 data stored in the first region 101, the fine program operation for the word line WL0 is made depending on D0, D1, D4, and D5 data stored in the first region 101. Afterwards, before D254 data is stored in the first region 101, the remaining data D10 to D253 may be stored in the second region 102 in the same order as the 1-step program operation of D6 and D7 data, the coarse program operation of D8 and D9 data, and the fine program operation of D0, D1, D4, and D5 data.

In the case that D254 and D255 data is stored in the first region 101, the coarse program operation for the word line WL63 is carried out depending upon D254 and D255 data stored in the first region 101. After the coarse program operation for the word line WL63 is carried out depending upon D254 and D255 data stored in the first region 101, the fine program operation for the word line WL62 is made depending upon D246, D247, D252, and D253 data stored in the first region 101. Finally, the fine program operation for the word line WL63 is made depending upon D250, D251, D254, and D255 data stored in the first region 101.

As will be understood from FIG. 4, it is possible to judge an SLC program operation, a set of SLC and 1-step program operations, a set of SLC and coarse program operations, a set of SLC, coarse, and fine program operations, and a set of SLC, coarse, fine, and fine program operations, depending upon data to be stored in the first region 101, that is, a page address of data to be stored in the first region 101. The SLC program operation, the 1-step program operation, the coarse program operation, or the fine program operation, for example, may be carried out when corresponding commands are provided to the multi-bit memory device 100 from the memory controller 200. Alternatively, a command set indicating a program pattern is provided to the multi-bit memory device 100, and the multi-bit memory device 100 performs a set of operations automatically according to the command set. The program pattern is formed of an SLC program operation, a set of SLC and 1-step program operations, a set of SLC and coarse program operations, a set of SLC, coarse, and fine program operations, or a set of SLC, coarse, fine, and fine program operations. A set of program operations in a program pattern may be changed according to an address scramble technique, a cell-per-bit number, and the like. The following table 1 shows program patterns applied to a program operation described in connection with FIGS. 3 and 4.

TABLE 1

| Program pattern | Program set |
|---|---|
| Pattern 1 | SLC program |
| Pattern 2 | SLC program + 1-step program |
| Pattern 3 | SLC program + coarse program |
| Pattern 4 | SLC program + coarse program + fine program |
| Pattern 5 | SLC program + coarse program + fine program + fine program |

Figure 5:
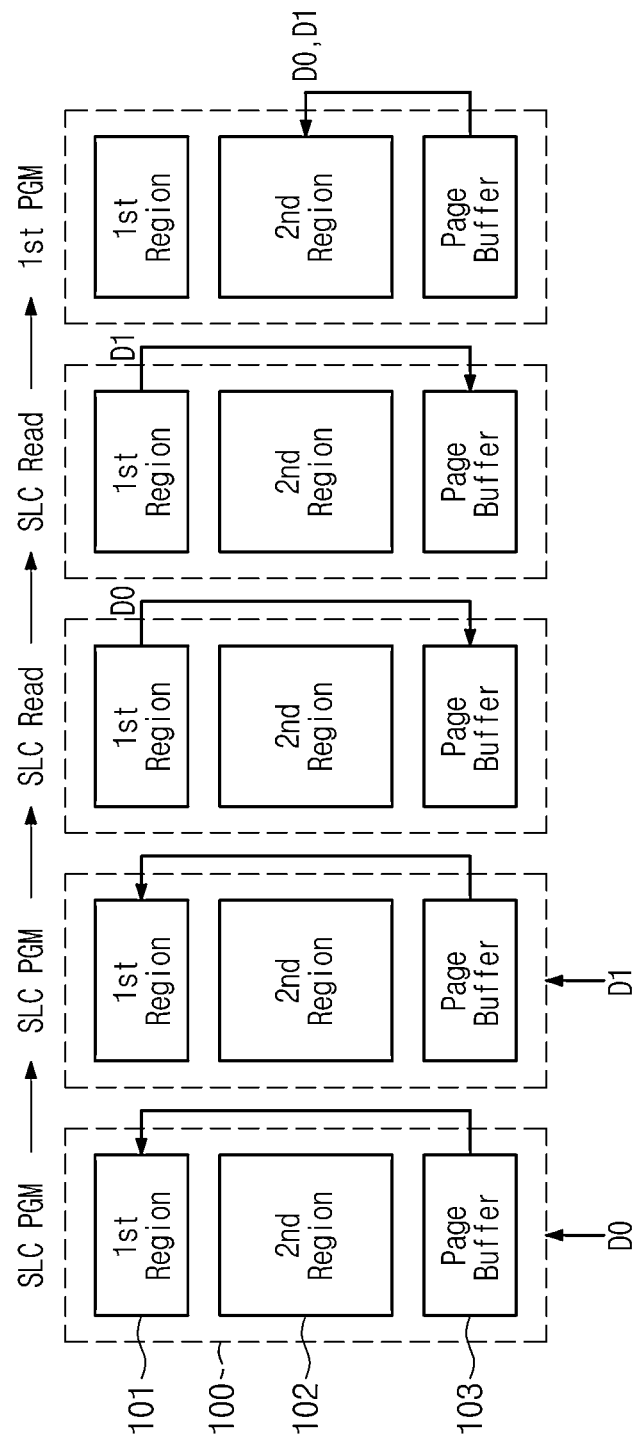
FIG. 5 is a diagram showing an exemplary data flow according to a set of single-bit and 1-step program operations described in FIG. 4.

FIG. 5 is a diagram showing an example of a data flow according to a set of single-bit and 1-step program operations described in connection with FIG. 4.

Referring to FIG. 5, data D0 is loaded onto a page buffer 103 of a multi-bit memory device 100, and the loaded data D0 is stored in the first region 101. Then, data D1 is loaded onto the page buffer 103 of the multi-bit memory device 100, and the loaded data D1 is stored in the first region 101. When the D0 and D1 data is stored in the first region 101, that is, when data (for example, 2-page) of the minimum program unit for the second region 102 is gathered at the first region 101, the D0 and D1 data is read from the first region 101 through the page buffer 103, sequentially. Afterwards, the D0 and D1 data stored in the page buffer 103 is stored in the second region 102 according to the 1-step program operation. Data transfer from the first region 101 to the page buffer 103 may be made by the SLC read operation. A set of single/SLC read operation and 1-step program operation may be carried out automatically without intervention of the memory controller 200. In another embodiment, the single-bit read operation, the 1-step program operation, the coarse program operation, and the fine program operation may be made according to the control of the memory controller 200. Each of the 1-step program operations illustrated in FIG. 5 is carried out substantially identically to that illustrated in FIG. 4, and description thereof is thus omitted.

Figure 6:
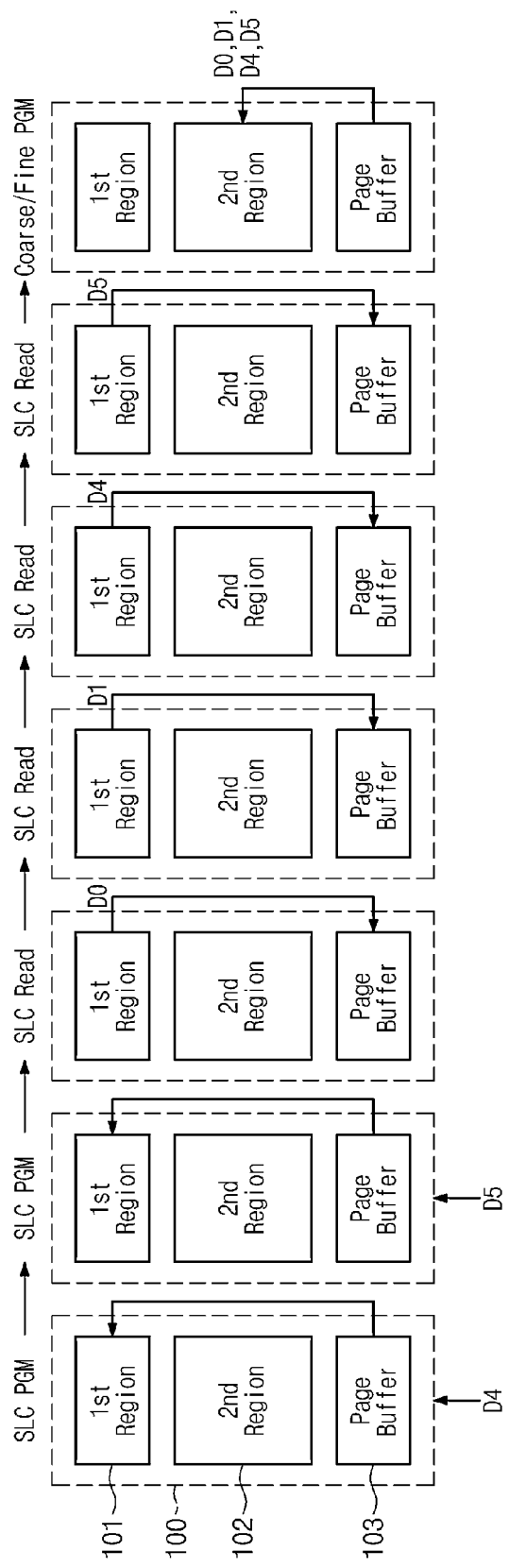
FIG. 6 is a diagram showing an exemplary data flow according to a set of single-bit and coarse/fine program operations described in FIG. 4.

FIG. 6 is a diagram showing data flow according to a set of single-bit and coarse/fine program operations described in FIG. 4.

Referring to FIG. 6, data D4 is loaded onto a page buffer 103 of a multi-bit memory device 100, and the loaded data D4 is stored in the first region 101. Then, data D5 is loaded onto the page buffer 103 of the multi-bit memory device 100, and the loaded data D5 is stored in the first region 101. When the D4 and D5 data is stored in the first region 101, that is, when data (for example, 2-page) of the minimum program unit for the second region 102 is gathered at the first region 101, as illustrated in FIG. 6, D0, D1, D4, and D5 data is read from the first region 101 through the page buffer 103 according to the SLC read operation, sequentially. Afterwards, the D0, D1, D4, and D5 data stored in the page buffer 103 is stored in the second region 102 through the coarse program operation. A set of single/SLC read operation and coarse program operation may be carried out automatically without intervention of the memory controller 200. In another embodiment, the single-bit read operation, the 1-step program operation, the coarse program operation, and the fine program operation may be made according to the control of the memory controller 200. The coarse program operations illustrated in FIG. 6 is carried out substantially identically to that illustrated in FIG. 4, and description thereof is thus omitted.

The fine program operation may be carried out in the same manner as the coarse program operation. For example, the fine program operation for a word line WL0 is accomplished by transferring D0, D1, D4, and D5 data of the first region 101 to the page buffer 103 sequentially and storing the D0, D1, D4, and D5 data of the page buffer 103 in the second region 102.

Figure 7:
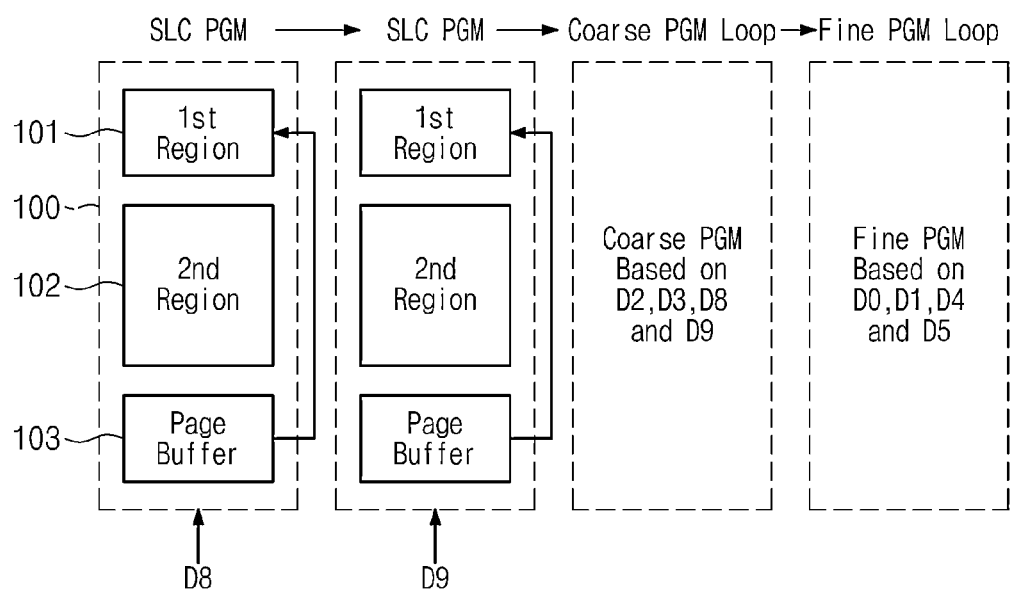
FIG. 7 is a diagram showing an exemplary data flow according to a set of single-bit, coarse, and fine program operations described in FIG. 4.

FIG. 7 is a diagram showing data flow according to a set of single-bit, coarse, and fine program operations described in FIG. 4.

Referring to FIG. 7, data D8 is loaded onto a page buffer 103 of a multi-bit memory device 100, and the loaded data D8 is stored in the first region 101. Then, data D9 is loaded onto the page buffer 103 of the multi-bit memory device 100, and the loaded data D9 is stored in the first region 101. When the D8 and D9 data is stored in the first region 101, that is, when data of the minimum program unit for the second region 102 is gathered at the first region 101, the coarse program operation for a word line WL1 is performed. That is, D2, D3, D8, and D9 data is sequentially read out from the first region 101 through the page buffer 103 according to the SLC read operation. The D2, D3, D8, and D9 data in the page buffer 103 is stored in the second region 102 by the coarse program operation. After the coarse program operation for the word line WL1 is carried out, without intervention of the memory controller 200, there is made the fine program operation for the word line WL0. That is, D0, D1, D4, and D5 data is sequentially read out from the first region 101 through the page buffer 103 according to the SLC read operation, and the D0, D1, D4, and D5 data of the page buffer 103 is stored in the second region 102 according to the fine program operation.

Figure 8:
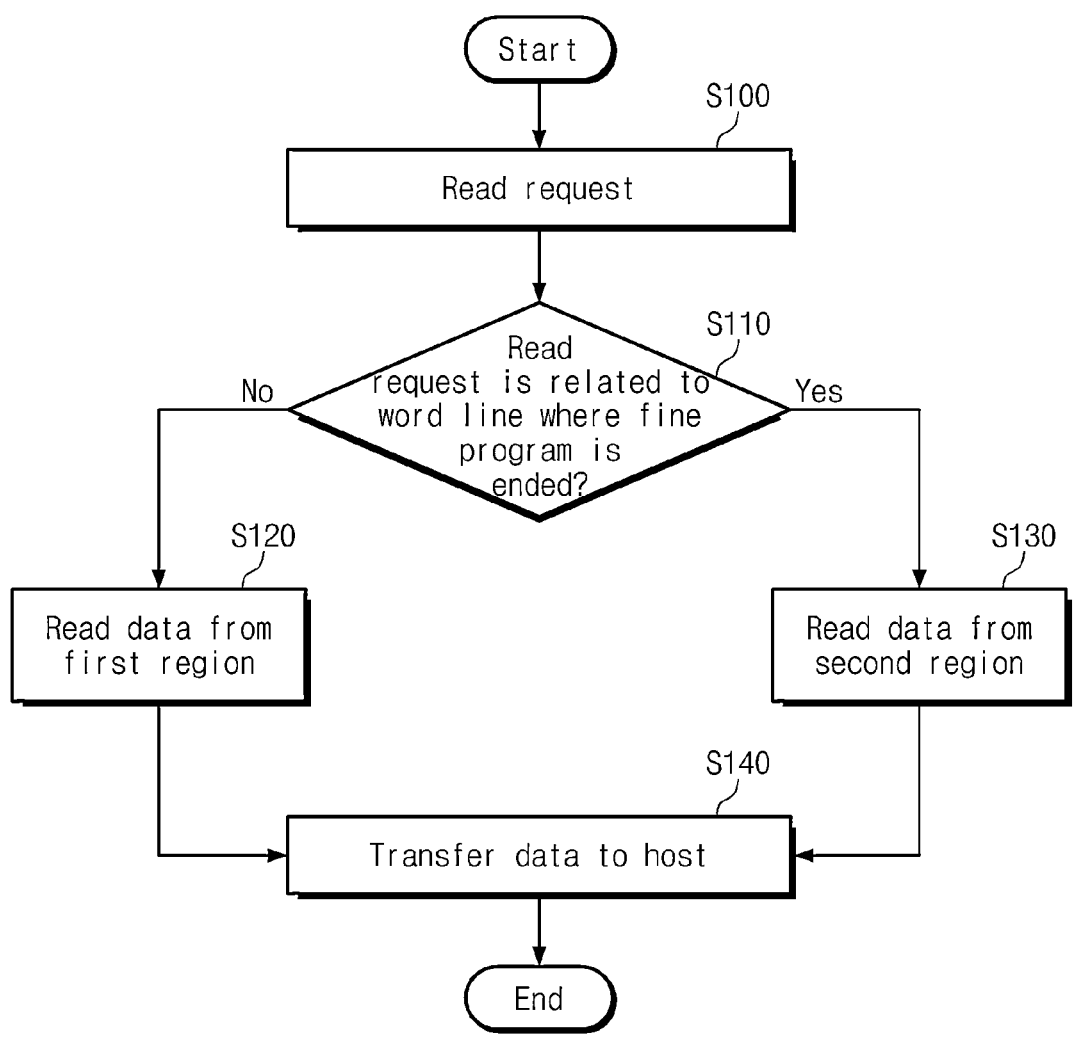
FIG. 8 is a flow chart for describing a read operation of a memory system illustrated in FIG. 2 in accordance with an embodiment of the inventive concepts.

FIG. 8 is a flow chart for describing a read operation of a memory system illustrated in FIG. 2. A read operation of a memory system according to an exemplary embodiment of the inventive concepts will be more fully described below.

In step S100, a read operation is requested from an external device (for example, a host). In step S110, a memory controller 200 determines whether the read request is related to a word line whose fine program operation is completed. Whether the fine program operation for each word line is completed is determined based on address mapping information. In the event that the read request is associated with a word line whose fine program operation is completed, in step S120, the memory controller 200 controls a multi-bit memory device 100 such that requested data is read from the second region 102 of the memory device 100. The read operation for the second region 102 is an MLC read operation. Data read from the second region 102 is temporarily stored in a buffer memory 201 of the memory controller 200. Thereafter, the procedure advances to step S140. In step S110, if the read request is associated with a word line whose fine program operation is not completed, in step S130, the memory controller 200 controls the multi-bit memory device 100 such that requested data is read from the first region 101. The read operation for the first region 101 is an SLC read operation. Data read from the first region 101 is temporarily stored in the buffer memory 201 of the memory controller 200. Thereafter, the procedure advances to step S140, in which data stored in the buffer memory 201 is sent to the external device, that is, the host 300.

Figure 10:
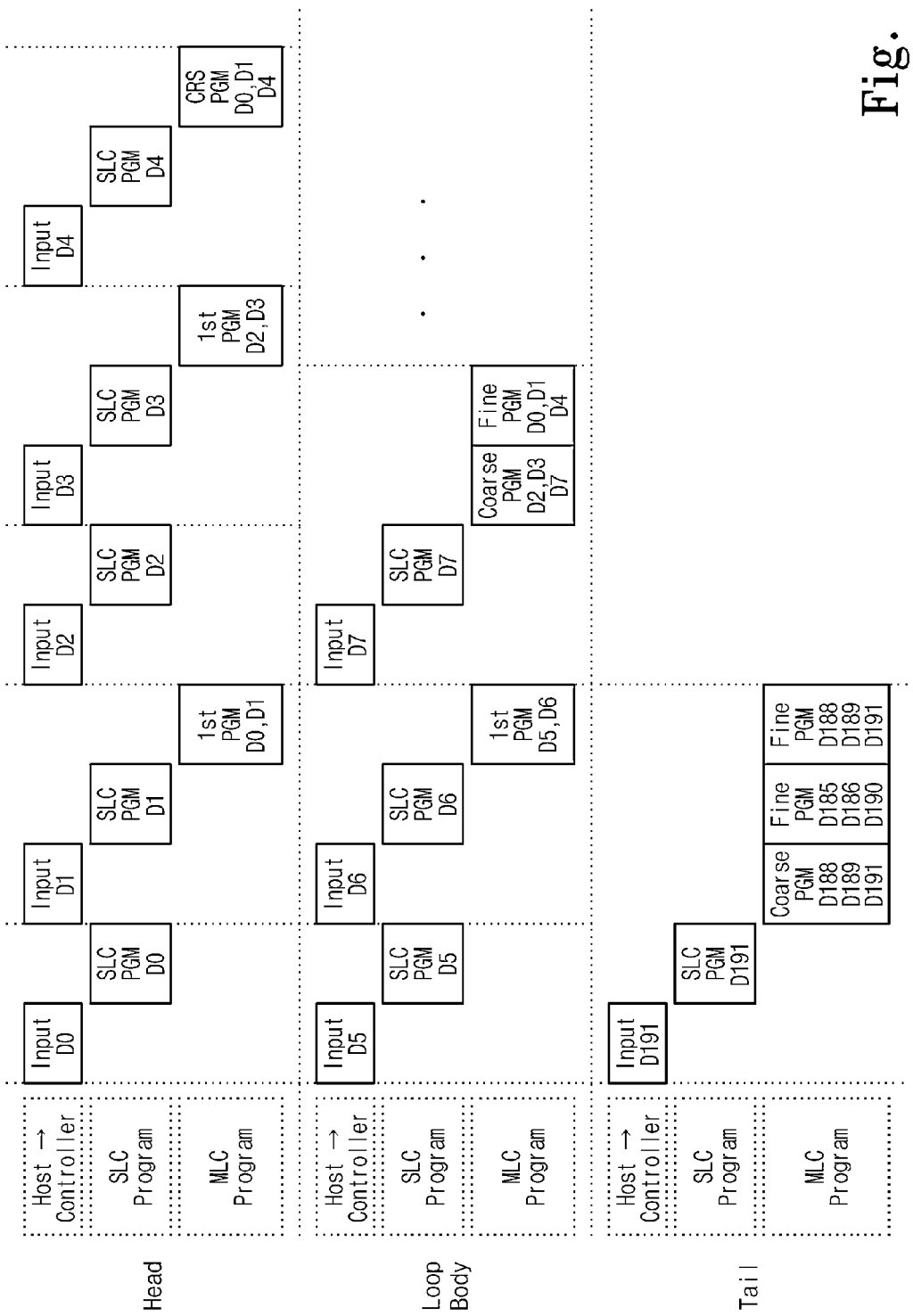
FIG. 10 is a diagram showing an exemplary data flow during a program operation of a data storage system where an address scramble technique illustrated in FIG. 9 is applied.

FIG. 9 is a diagram for explaining an exemplary address scramble technique of a multi-bit memory device which stores 3-bit data per cell and to which a 3-step reprogram method is applied, and FIG. 10 is a diagram showing an example of a data flow during a program operation of a data storage system where an address scramble technique illustrated in FIG. 9 is applied. A program operation of a data storage system according to another exemplary embodiment of the inventive concepts will be more fully described below.

For ease of description, as illustrated in FIG. 9, it is assumed that each memory block includes 64 word lines WL0 to WL63 and that each memory cell stores 3-bit data. With this assumption, 3 pages are stored in the memory cells of each word line, and 192 pages are stored in each memory block.

As described in FIGS. 3 and 4, directly after data Di (i being 0 to 191) of the minimum program unit for the first region 101 is stored in a buffer memory 201 of a memory controller 200, data Di stored in the buffer memory 201 is programmed in the first region 101 of a multi-bit memory device 100 through an SLC program operation. Further, the memory controller 200 determines whether data of the minimum program unit for the second region 102 is gathered at the first region 101. A 1-step program operation, a coarse program operation, or a fine program operation for the second region 102 is carried out according to the determination result. A 1-step program operation, a coarse program operation, or a fine program operation for the second region 102 is determined according to an address scramble order illustrated in FIG. 9. For example, in a case where D0 and D1 data is stored in the first region 101, the 1-step program operation for a word line WL0 is performed depending upon the D0 and D1 data stored in the first region 101. If D2 and D3 data is stored in the first region 101, the 1-step program operation for a word line WL1 is performed depending upon the D2 and D3 data stored in the first region 101.

Continuously, if data D4 is stored in the first region 101, the coarse program operation for the word line WL0 is made depending upon the D0, D1, and D4 data stored in the first region 101. When D5 and D6 data is stored in the first region 101, the 1-step program operation for a word line WL2 is made depending upon the D5 and D6 data stored in the first region 101. When data D7 is stored in the first region 101, the coarse program operation for the word line WL1 is carried out depending upon the D2, D3, and D7 data stored in the first region 101. After the coarse program operation for the word line WL1 is carried out depending upon the D2, D3, and D7 data stored in the first region 101, the fine program operation for the word line WL0 is carried out depending upon the D0, D1, and D4 data stored in the first region 101. Thereafter, until data D191 is stored in the first region 101, the remaining data D8 to D190 may be stored in the second region 102 in the same order as the 1-step program operation of D5 and D6 data, the coarse program operation of data D7, and the fine program operation of D0, D1, and D4 data.

In the event that data D191 is stored in the first region 101, the coarse program operation for a word line WL63 is made depending upon D188, D189, and D191 data stored in the first region 101. After the coarse program operation for a word line WL63 is made depending upon D188, D189, and D191 data stored in the first region 101, the fine program operation for a word line WL62 is made depending upon D185, D186, and D190 data stored in the first region 101. Finally, the fine program operation for the word line WL63 is made depending upon D188, D189, and D191 data stored in the first region 101.

Even though 3-bit data is stored in each memory cell, a method of reading data from the multi-bit memory device 100 is substantially the same as that described above in connection with FIG. 8, and description thereof is thus omitted.

As described in connection with FIG. 4, a program operation corresponding to FIG. 10 may include program patterns. The program patterns may include an SLC program operation, a set of SLC and 1-step program operations, a set of SLC and coarse program operations, a set of SLC, coarse, and fine program operations, and a set of SLC, coarse, fine, and fine program operations. Each program operation is made whenever a command is sent to a multi-bit memory device 100 from a memory controller 200, or a set of program operations in each program pattern is automatically performed by the multi-bit memory device 100.

Figure 11:
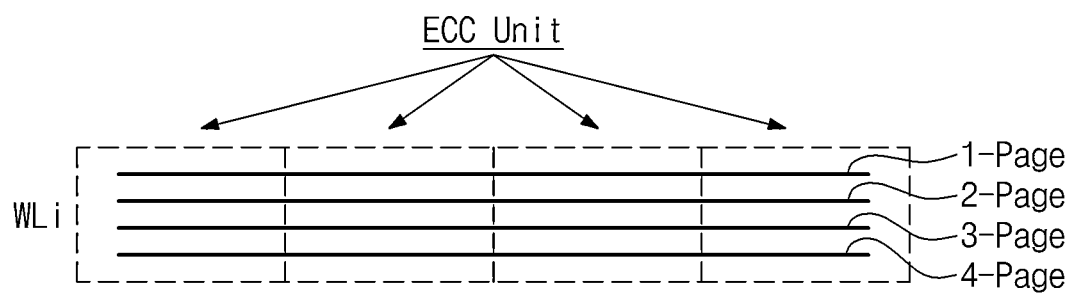
FIG. 11 is a diagram for describing a page interleave technique according to an exemplary embodiment of the inventive concepts.

FIG. 11 is a diagram for describing a page interleave technique according to an exemplary embodiment of the inventive concepts.

For ease of description, it is assumed that 4-page data is stored in memory cells in one word line. In general, generation of ECC data is made by a page unit. On the other hand, in the case of a page interleave technique for equalizing the error rate of each page, pages to be stored in memory cells of each word line are divided into a plurality of ECC groups (for example, four ECC groups). ECC data is generated according to data in each ECC group. In the event that the page interleave technique is applied to a data storage system 1000, the minimum program unit for the first region 101 may be different from that described above. This will be more fully described with reference to FIG. 12.

Figure 12:
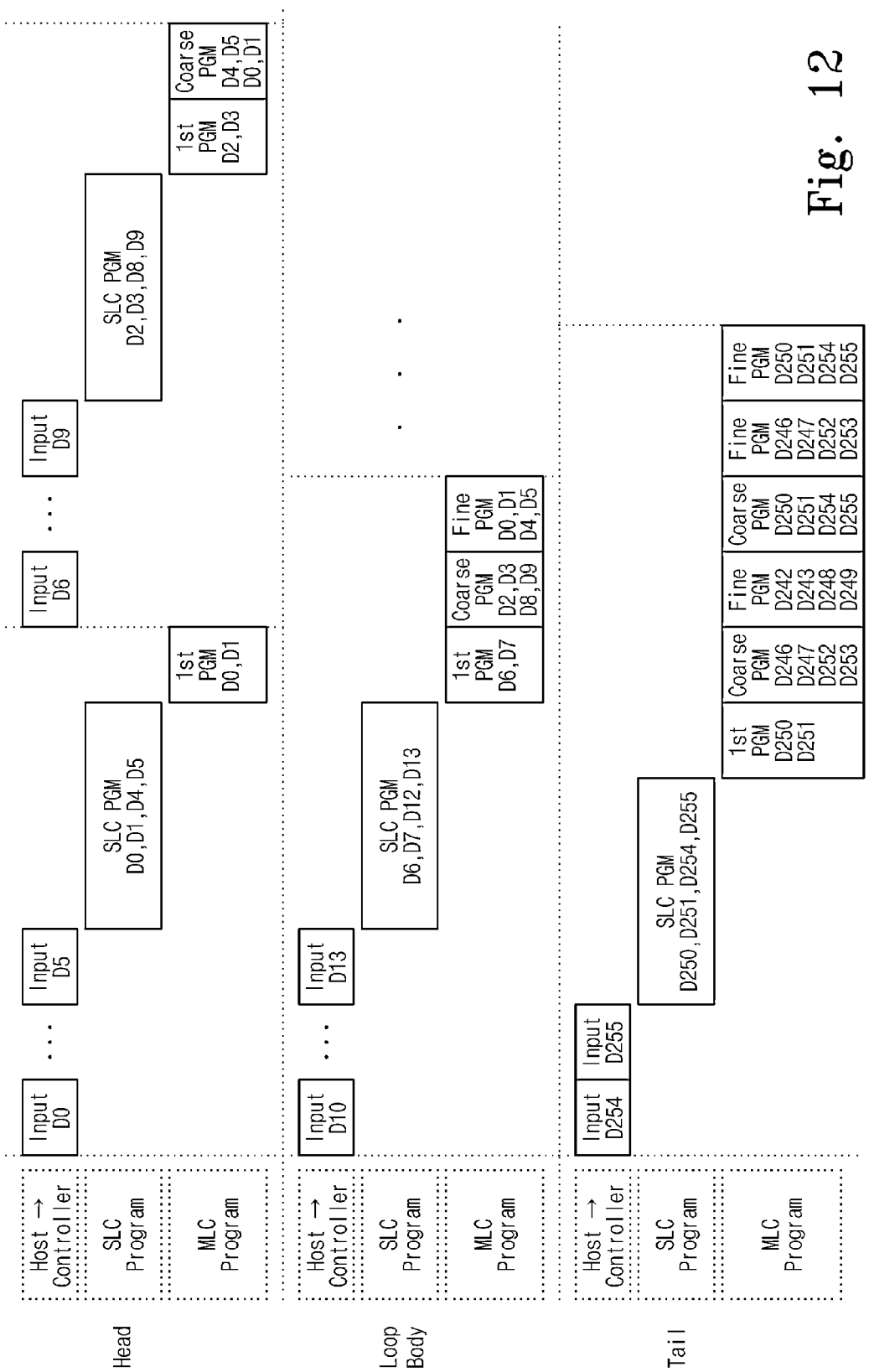
FIG. 12 is a diagram showing an exemplary data flow during a program operation of data storage system to which a page interleave technique described in FIG. 11 is applied.

FIG. 12 is a diagram showing an example of a data flow during a program operation of data storage system to which a page interleave technique described in connection with FIG. 11 is applied. A program operation of a data storage system according to another exemplary embodiment of the inventive concepts will be more fully described below.

For ease of illustration, it is assumed that each memory block includes 64 word lines WL0 to WL63 and that each memory cell stores 4-bit data. With this assumption, 4 pages are stored in the memory cells of each word line, and 256 pages are stored in each memory block. A program operation of a data storage system with a page interleave technique will be described under the assumption that an address scramble technique described in FIG. 3 is used.

Referring to FIG. 12, data is transferred to a memory controller 200 from a host 300. Since a page interleave technique is used, the memory controller 200 waits until data to be stored in a word line WL0, that is, 4-page data D0, D1, D4, and D5 is stored. Once data to be stored in a word line WL0, that is, 4-page data D0, D1, D4, and D5 is stored in a buffer memory 201, data to be stored in a word line WL0, that is, 4-page data D0, D1, D4, and D5 is stored sequentially in the first region 101 of a multi-bit memory device 100 according to control of the memory controller 200. As described above, the data is stored in the first region 101 through a single-bit/SLC program operation. Then, a 1-step program operation for a word line WL0 is carried out depending upon the D0 and D1 data stored in the first region 101. When page data D6 to D9 is received to the memory controller 200 from the host 300, data to be stored in a word line WL1, that is, 4-page data D2, D3, D8, and D9 is stored sequentially in the first region 101 of the multi-bit memory device 100 according to control of the memory controller 200. A 1-step program operation for a word line WL1 and a coarse program operation for the word line WL0 are carried out sequentially depending upon the D2 and D3 data and the D4 and D5 data stored in the first region 101.

When page data D10 to D13 is received to the memory controller 200 from the host 300, data to be stored in the word line WL1, that is, 4-page data D6, D7, D12, and D13 is stored sequentially in the first region 101 of the multi-bit memory device 100 according to control of the memory controller 200. A 1-step program operation for a word line WL3, a coarse program operation for the word line WL1, and a fine program operation for the word line WL0 are carried out sequentially depending upon data stored in the first region 101. An operating pattern carried out when data D10 to D14 is received is repeated until data D254 is stored in the buffer memory 201.

If data D254 and D255 is stored in the buffer memory 201 of the memory controller 200, data to be stored at a word line WL63, that is, 4-page data D250, D251, D254, and D255 is stored sequentially in the first region 101 of the multi-bit memory device 100 according to control of the memory controller 200. Then, the 1-step program operation for the word line WL63, the coarse program operation for the word line WL62, the fine program operation for the word line WL61, the coarse program operation for the word line WL63, the fine program operation for the word line WL62, and the fine program operation for the word line WL63 may be sequentially performed according to data stored in the first region 101.

In an exemplary embodiment, a size of the first region 101 of the multi-bit memory device 100 is determined depending upon the number of open blocks and the minimum page number to be retained by the first region 101. Before the first memory block is filled by data, a random write operation can be requested with respect to a second memory block which is different from the first memory block. In this case, the first memory block is called an open block. The number of open blocks is capable of being variously determined according to the policy of managing the multi-bit memory device 100. The minimum page number to be retained by the first region 101 may correspond to the amount of data (for example, D0 to D9) stored in the second region 102 before a fine program operation for a word line (for example, WL0) is completed. The minimum page number to be retained by the first region 101, for example, may be about 10-pages in a case where an address scramble technique in FIG. 3 is applied to a data storage system.

Figure 14:
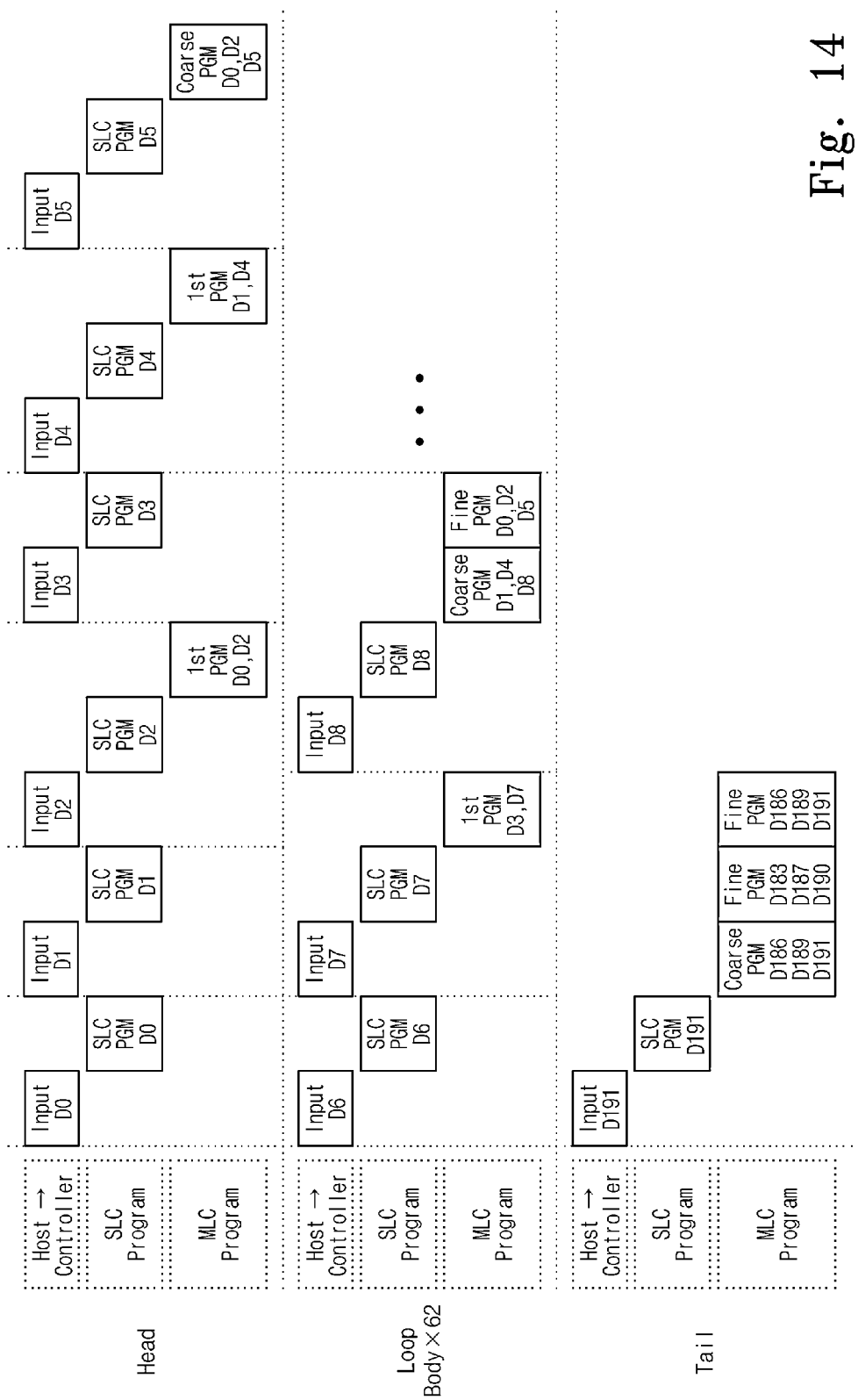
FIG. 14 is a diagram showing an exemplary data flow during a program operation of a data storage system illustrated in FIG. 2.

FIG. 13 is a diagram for describing an exemplary address scramble technique of a multi-bit memory device which stores 3-bit data per cell and to which a 3-step reprogram method is applied, and FIG. 14 is a diagram showing an example of a data flow during a program operation of a data storage system illustrated in FIG. 12. An operation of a data storage system according to an exemplary embodiment of the inventive concept will be more fully described below.

In order to simplify the description, as illustrated in FIG. 13, it is assumed that each memory block includes 64 word lines WL0 to WL63 and that each memory cell stores 3-bit data. With this assumption, 3 pages are stored in the memory cells of each word line, and 192 pages are stored in each memory block.

First of all, if data D0 of the minimum program unit for the first region 101 is transferred to a buffer memory 201 of a memory controller 200 from a host 300, the data D0 stored in the buffer memory 201 is programmed in the first region 101 of the multi-bit memory device 100 according to control of the memory controller 200. As described above, the data D0 is programmed in the first region 101 through an SLC program operation. The memory controller 200 determines whether data of the minimum program unit for the second region 102 is gathered at the first region 101, and controls a main program operation according to the determination result. Whether data of the minimum program unit for the second region 102 is gathered at the first region 101 may be determined according to a page address. Since only one page D0 is stored in the first region 101, the main program operation is not carried out. If data D1 of the minimum program unit for the first region 101 is transferred to the buffer memory 201 of the memory controller 200 from the host 300, the data D1 stored in the buffer memory 201 is programmed in the first region 101 of the multi-bit memory device 100 according to control of the memory controller 200.

If data D2 of the minimum program unit for the first region 101 is transferred to the buffer memory 201 of the memory controller 200 from the host 300, the data D2 stored in the buffer memory 201 is programmed in the first region 101 of the multi-bit memory device 100 according to control of the memory controller 200. Since data of the minimum program unit for the second region 102 (for example, 2-page necessary for a 1-step program operation) is gathered at the first region 101, the memory controller 200 controls the multi-bit memory device 100 such that data D0 and D2 stored in the first region 101 is stored in the second region 102. That is, the 1-step program operation for a word line WL0 is made based on the data D0 and D2 stored in the first region 101.

If data D3 of the minimum program unit for the first region 101 is transferred to the buffer memory 201 of the memory controller 200 from the host 300, the data D3 stored in the buffer memory 201 is programmed in the first region 101 of the multi-bit memory device 100 according to control of the memory controller 200. If data D4 of the minimum program unit for the first region 101 is transferred to the buffer memory 201 of the memory controller 200 from the host 300, the data D4 stored in the buffer memory 201 is programmed in the first region 101 of the multi-bit memory device 100 according to control of the memory controller 200. Since data of the minimum program unit for the second region 102 (for example, 2-page necessary for a 1-step program operation) is gathered at the first region 101, the memory controller 200 controls the multi-bit memory device 100 such that data D1 and D4 stored in the first region 101 is stored in the second region 102. That is, the 1-step program operation for a word line WL1 is made based on the data D1 and D4 stored in the first region 101.

As described above, if data of the minimum program unit for the first region 101 is stored in the buffer memory 201, data stored in the buffer memory 201 is programmed in the first region 101 of the multi-bit memory device 100 under control of the memory controller 200. Data is stored in the first region 101 through the SLC program operation. If data Di (i being 0 to 191) of the minimum program unit for the first region 101 is stored in the buffer memory 201, as described in FIG. 14, data stored in the buffer memory 201 is programmed in the first region 101 of the multi-bit memory device 100 through the SLC program operation under control of the memory controller 200. Together with the determination of whether data of the minimum program unit for the first region 101 is stored in the buffer memory 201, the memory controller 200 determines whether data of the minimum program unit for the second region 102 is gathered at the first region 101. The memory controller 200 may control the 1-step program operation, the coarse program operation, or the fine program operation for the second region 102, depending upon the determination result, which will be more fully described below.

The 1-step program operation, the coarse program operation, or the fine program operation for the second region 102 may be determined in an address scramble technique illustrated in FIG. 13. For example, in the event that D0 and D2 data is stored in the first region 101, the 1-step program operation for a word line WL0 is carried out depending upon the D0 and D2 data stored in the first region 101. If D1 and D4 data is stored in the first region 101, the 1-step program operation for a word line WL1 is carried out. That is, the 1-step program operation for the word line WL1 is carried out depending upon the D1 and D4 data stored in the first region 101.

Continuously, if D5 data is stored in the first region 101, the coarse program operation for the word line WL0 is carried out depending upon the D0, D2, and D5 data stored in the first region 101. When D3 and D7 data is stored in the first region 101, the 1-step program operation for the word line WL2 is carried out depending upon the D3 and D7 data stored in the first region 101. In the event that D8 data is stored in the first region 101, the coarse program operation for the word line WL1 is carried out depending upon the D1, D4, and D8 data stored in the first region 101. After the coarse program operation for the word line WL1 is carried out depending upon the D1, D4, and D8 data stored in the first region 101, the fine program operation for the word line WL0 is made depending on D0, D2, and D5 data stored in the first region 101. Afterwards, until D191 data is stored in the first region 101, the remaining data D10 to D190 may be stored in the second region 102 in the same order as the 1-step program operation of D3 and D7 data, the coarse program operation of D1, D4 and D8 data, and the fine program operation of D0, D2, and D5 data.

In the case that D191 data is stored in the first region 101, the coarse program operation for the word line WL63 is carried out depending upon D186, D189, and D191 data stored in the first region 101. After the coarse program operation for the word line WL63 is carried out depending upon D186, D189, and D191 data stored in the first region 101, the fine program operation for the word line WL62 is made depending upon D183, D187, and D190 data stored in the first region 101. Finally, the fine program operation for the word line WL63 is made depending upon D186, D189, and D191 data stored in the first region 101.

As will be understood from FIG. 14, it is possible to determine an SLC program operation (for example, the first program pattern), a set of SLC and 1-step program operations (for example, the second program pattern), a set of SLC and coarse program operations (for example, the third program pattern), a set of SLC, coarse, and fine program operations (for example, the fourth program pattern), and a set of SLC, coarse, fine, and fine program operations (for example, the fifth program pattern), depending upon data to be stored in the first region 101, that is, a page address of data to be stored in the first region 101. As described with reference to the table 1 above, the SLC program operation, the 1-step program operation, the coarse program operation, or the fine program operation, for example, may be carried out when corresponding commands are provided to the multi-bit memory device 100 from the memory controller 200. Alternatively, a command set representative of a program pattern is provided to the multi-bit memory device 100, and the multi-bit memory device 100 performs a set of operations automatically according to the command set. The program pattern is formed of an SLC program operation, a set of SLC and 1-step program operations, a set of SLC and coarse program operations, a set of SLC, coarse, and fine program operations, or a set of SLC, coarse, fine, and fine program operations. A set of program operations in a program pattern may be changed according to an address scramble technique, a bit-per-cell number, and the like.

Figure 15:
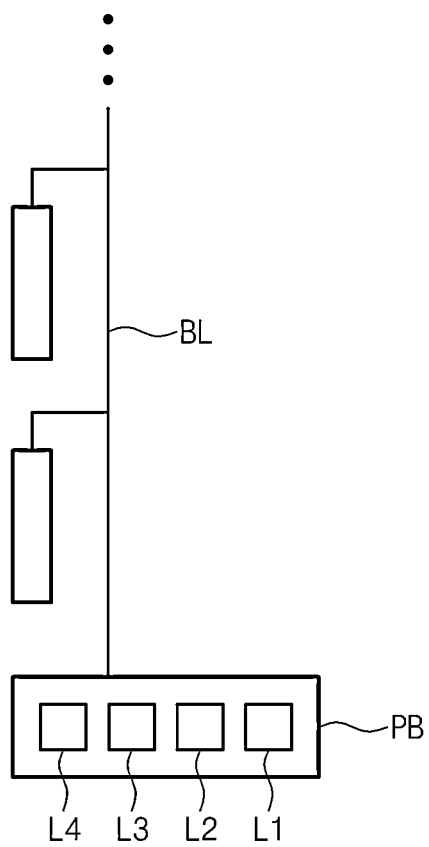
FIG. 15 is a diagram showing a page buffer structure of a multi-bit memory device according to an exemplary embodiment of the inventive concepts.

FIG. 15 is a diagram showing a page buffer structure of a multi-bit memory device according to an exemplary embodiment of the inventive concepts.

Referring to FIG. 15, a bit line is connected with a plurality of strings (e.g., NAND strings). Any one of the strings may be connected with a page buffer PB via the bit line BL. The page buffer PB may include a plurality of latches. The number of latches in the page buffer PB may be determined according to the number of data bits stored in a memory cell. Each string includes a plurality of memory cells, each of which stores multi-bit data. For example, each memory cell may store 3-bit data. In this case, the page buffer PB may include at least four latches L1, L2, L3, and L4. In a buffer program operation, data to be stored in the first region 101 may be loaded onto the first latch L1. At a main program operation, data stored in the first region 101 may be read out via the first latch L1. Data in the first latch L1 may be dumped into any one of the second to fourth latches L2 to L4 under the control of the memory controller 200. In an exemplary embodiment, a specific command (for example, a command informing a dump operation) may be provided to the multi-bit memory device 100 from the memory controller 200 in order to dump data in the first latch L1 into any one of the remaining second to fourth latches L2 to L4. At this time, information directing a latch into which data in the first latch L1 is dumped may be provided to the multi-bit memory device 100 from the memory controller 200.

In FIG. 15, there is exemplarily illustrated an example that a page buffer PB includes four latches L1 to L4. However, the page buffer PB can be formed to include a higher or lower number of latches according to a bit number per cell. Further, the page buffer PB may further include a register for caching.

Figure 16:
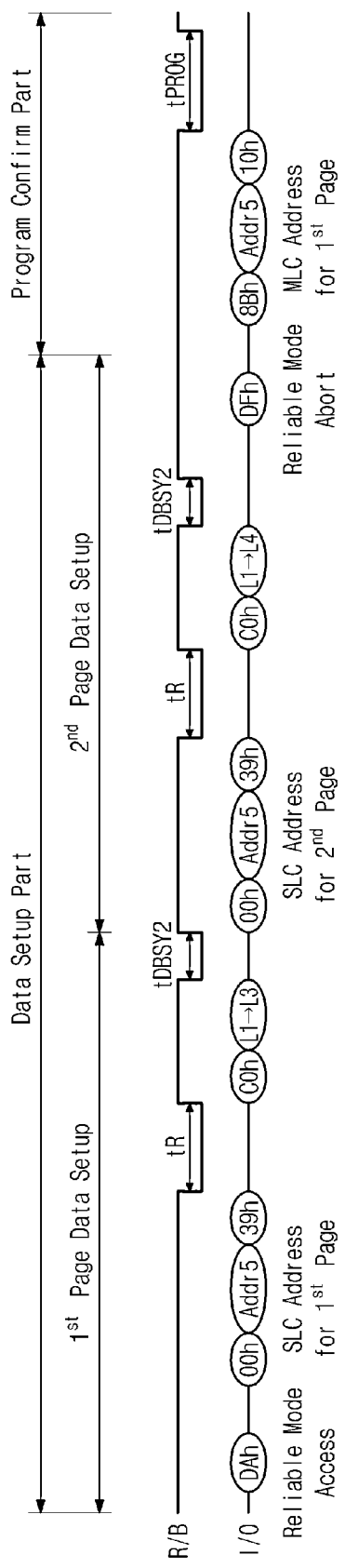
FIG. 16 is a diagram showing a command sequence for a 1-step program operation described in FIGS. 13 and 14.
Figure 17:
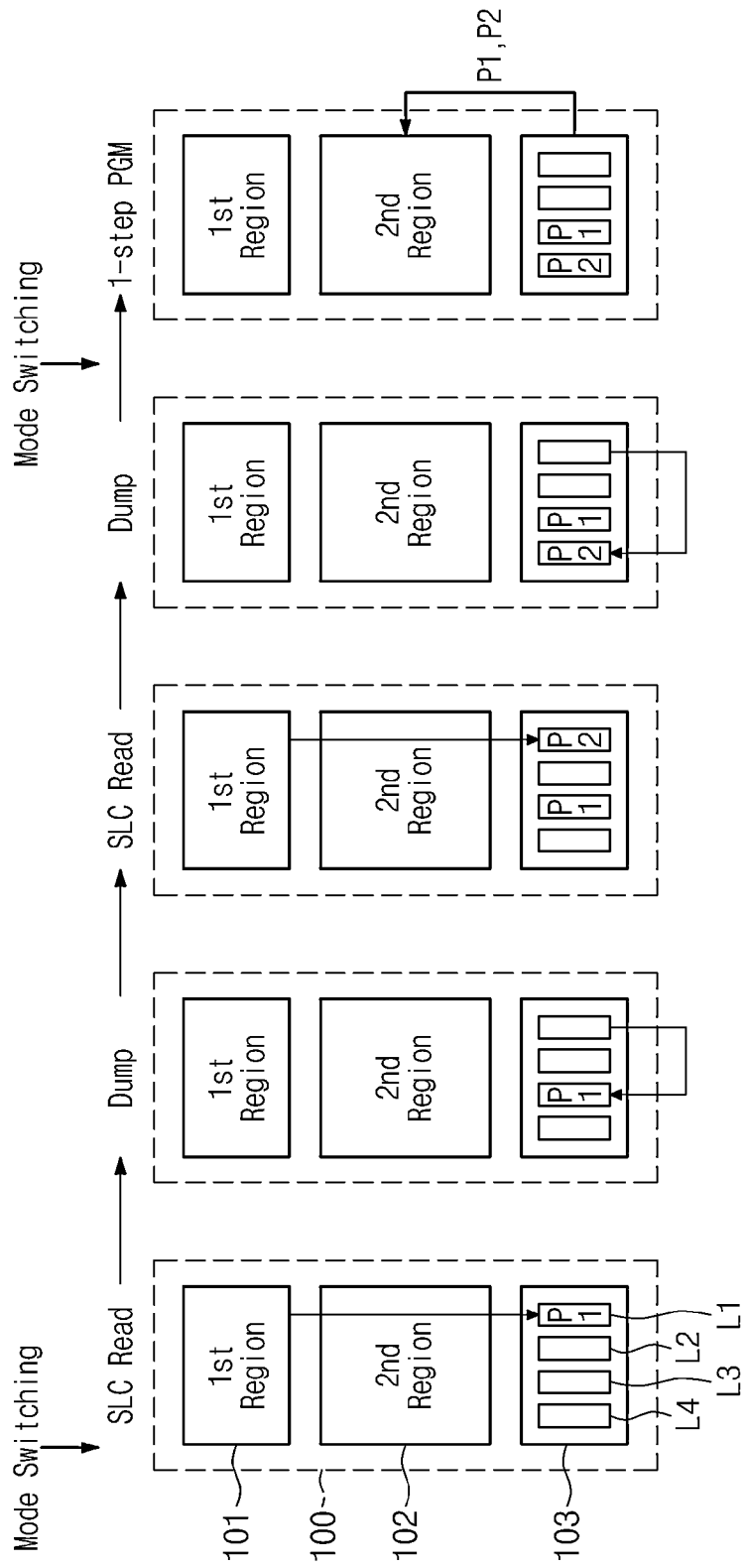
FIG. 17 is a diagram showing an exemplary data flow according to a 1-step program command sequence illustrated in FIG. 16.

FIG. 16 is a diagram showing a command sequence for a 1-step program operation described in FIGS. 13 and 14, and FIG. 17 is a diagram showing an example of a data flow according to a 1-step program command sequence illustrated in FIG. 16. An operation of a data storage system according to an exemplary embodiment of the inventive concepts will be more fully described below.

A 1-step program operation described in connection with FIGS. 13 and 14 may be made when a minimum program unit on the second region 102, that is, 2-page is stored in the first region 101. As a main program operation, a 1-step program operation on the second region 102 may accompany two SLC read operations on the first region 101 and one MLC program operation on the second region 102.

Referring to FIG. 16, in the case of a data storage system 1000 according to an exemplary embodiment of the inventive concepts, a command DAh for switching into an SLC mode of operation may be transferred to a multi-bit memory device 100 from a memory controller 200 before the 1-step program operation is executed. When the command DAh for mode switching is received, the multi-bit memory device 100 may recognize a command provided from the memory controller 200 as a command associated with an SLC operation, which includes an SLC read operation, a data dump operation, and the like.

Following the command DAh for mode switching, as illustrated in FIG. 16, the memory controller 200 may transfer a set of command 00h, address Addr5, and command 39h to the multi-bit memory device 100. At this time, the address Addr5 may be address for designating one page (for example, the first page P1) of 2-page data needed for the 1-step program operation. After the command 39h is received, a page buffer 103 of the multi-bit memory device 100 reads out the first page data P1 from the first region 101 as illustrated in FIG. 17. The read data P1 may be stored in the first latch L1. During a read operation, as illustrated in FIG. 16, the multi-bit memory device 100 may establish a ready/busy signal R/B so as to indicate a busy state. After the read operation is completed, the multi-bit memory device 100 may establish the ready/busy signal R/B so as to indicate a ready state.

Then, as illustrated in FIG. 16, the memory controller 200 responds to a state of the ready/busy signal R/B to transfer information (L1→L3), used to designate a latch (for example, L3) to which data is dumped, to the multi-bit memory device 100 together with a dump command C0h. As the dump command C0h is received, the multi-bit memory device 100 may control the page buffer 103 such that data P1 in the first latch L1 is dumped into the third latch L3. During a dump operation, as illustrated in FIG. 16, the multi-bit memory device 100 may establish a ready/busy signal R/B so as to indicate a busy state. After the dump operation is completed, the multi-bit memory device 100 may establish the ready/busy signal R/B so as to indicate a ready state.

Then, as illustrated in FIG. 16, the memory controller 200 may transfer a set of command 00h, address Addr5, and command 39h to the multi-bit memory device 100. At this time, the address Addr5 may be an address for designating the remaining page (for example, the second page P2) of 2-page data needed for the 1-step program operation. After the command 39h is received, the page buffer 103 of the multi-bit memory device 100 reads out the second page data P2 from the first region 101 as illustrated in FIG. 17. The read data P2 may be stored in the first latch L1. During a read operation, as illustrated in FIG. 16, the multi-bit memory device 100 may establish a ready/busy signal R/B so as to indicate a busy state. After the read operation is completed, the multi-bit memory device 100 may establish the ready/busy signal R/B so as to indicate a ready state.

Then, as illustrated in FIG. 16, the memory controller 200 responds to a state of the ready/busy signal R/B to transfer information (L1→L4), used to designate a latch (for example, L4) to which data is dumped, to the multi-bit memory device 100 together with a dump command C0h. As the dump command C0h is received, the multi-bit memory device 100 may control the page buffer 103 such that data P2 in the first latch L1 is dumped into the fourth latch L4. During a dump operation, as illustrated in FIG. 16, the multi-bit memory device 100 may establish a ready/busy signal R/B so as to indicate a busy state. After the dump operation is completed, the multi-bit memory device 100 may establish the ready/busy signal R/B so as to indicate a ready state.

Once data for the 1-step program operation is prepared, the 1-step program operation may be made with respect to the second region 102. Prior to performing the 1-step program operation, a command DFh for exiting from the SLC mode of operation may be transferred to the multi-bit memory device 100 from the memory controller. When the command DFh for mode switching is received, the multi-bit memory device 100 may recognize a command provided from the memory controller 200 as a command associated with a main program operation, that is, a command associated with an MLC operation. Afterwards, as illustrated in FIG. 16, the memory controller 200 may transfer a set of command 8Bh, address Addr5, and command 10h to the multi-bit memory device 100. At this time, the address Addr5 may be an address for designating one page (for example, the first page) of 1-step programmed pages. Since the page buffer 103 is set by data for the 1-step program operation, no data is transferred to the multi-bit memory device 100 from the memory controller 200. After the command 10h is received, as illustrated in FIG. 17, data P1 and P2 in the page buffer 103 may be programmed in the second region 102. During a program operation, as illustrated in FIG. 16, the multi-bit memory device 100 may establish a ready/busy signal R/B so as to indicate a busy state. After the program operation is completed, the multi-bit memory device 100 may establish the ready/busy signal R/B so as to indicate a ready state.

In accordance with the above description, a 1-step program operation may be formed of a data setup period and a program period (or, a program confirm period). At the 1-step program operation, as illustrated in FIG. 16, the data setup period may include the first page data setup period and the second page data setup period. Each of the first and second page data setup periods may include an SLC read operation and a dump operation. Mode switching may be made prior to the first page data setup operation and prior to main programming.

Figure 18:
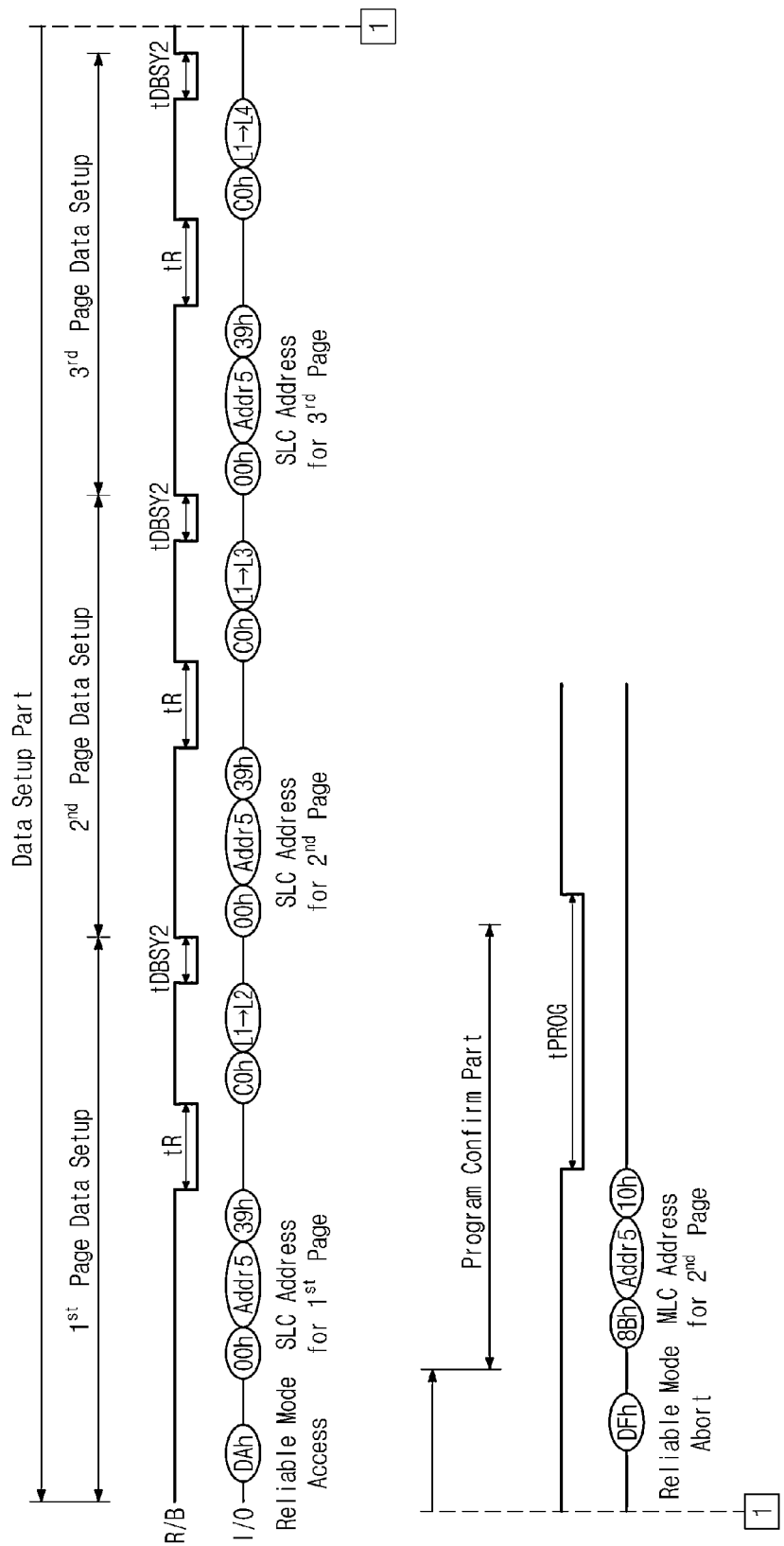
FIG. 18 is a diagram showing an exemplary command sequence for a coarse program operation described in FIGS. 13 and 14.
Figure 19:
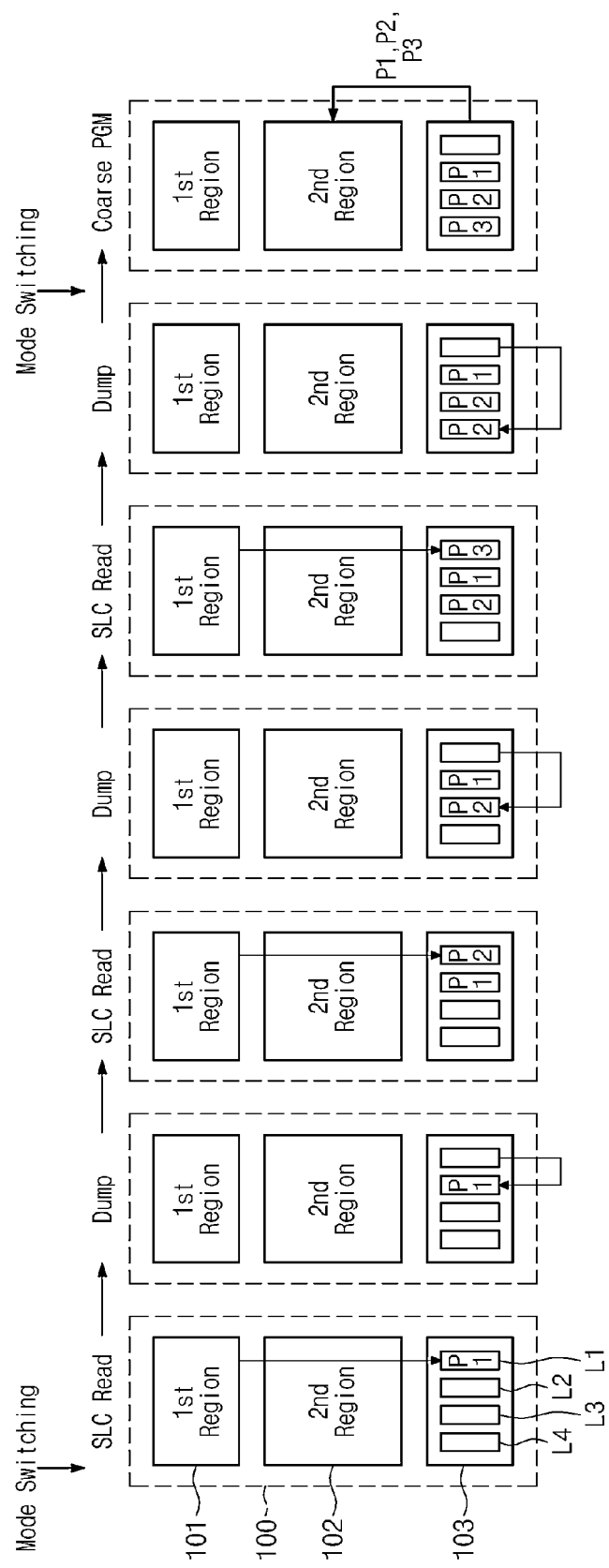
FIG. 19 is a diagram showing an exemplary data flow according to a coarse program command sequence illustrated in FIG. 18.

FIG. 18 is a diagram showing a command sequence for a coarse program operation described in connection with FIGS. 13 and 14, and FIG. 19 is a diagram showing an example of a data flow according to a coarse program command sequence illustrated in FIG. 18. An operation of a data storage system according to an exemplary embodiment of the inventive concepts will be more fully described below.

A coarse program operation described in connection with FIGS. 13 and 14 may be made when, as a minimum program unit on the second region 102, 3-page is stored in the first region 101. The coarse program operation on the second region 102 may accompany three SLC read operations for the first region 101 and one MLC program operation for the second region 102.

Each of the SLC read operations, as illustrated in FIG. 18, may be made to be identical to that described in connection with FIGS. 16 and 17, and a description thereof is thus omitted. Before an SLC read operation is made with respect to the first page data, as illustrated in FIG. 18, a command DAh for mode switching may be sent to the multi-bit memory device 100 from the memory controller 200. The MLC program operation on the second region 102 may be made in the same manner at that described in connection with FIGS. 16 and 17, except that 3-bit data is stored in the second region 102, and a description thereof is thus omitted. Prior to performing the coarse program operation, as illustrated in FIG. 18, a command DFh for mode switching may be sent to the multi-bit memory device from the memory controller 200.

Although not illustrated in figures, as a main program operation, a fine program operation may be performed in the same manner as that associated with a command sequence illustrated in FIG. 18. Since a command sequence for the fine program operation and a command sequence for the coarse program operation have the same command sequence, the coarse program operation and the fine program operation may be discriminated according to an address Addr5 provided within the program confirm period. For example, an address Addr5 provided within the program confirm period associated with the coarse program operation is an address for designating the second page, and an address Addr5 provided within the program confirm period associated with the fine program operation is an address for designating the third page.

Figure 20:
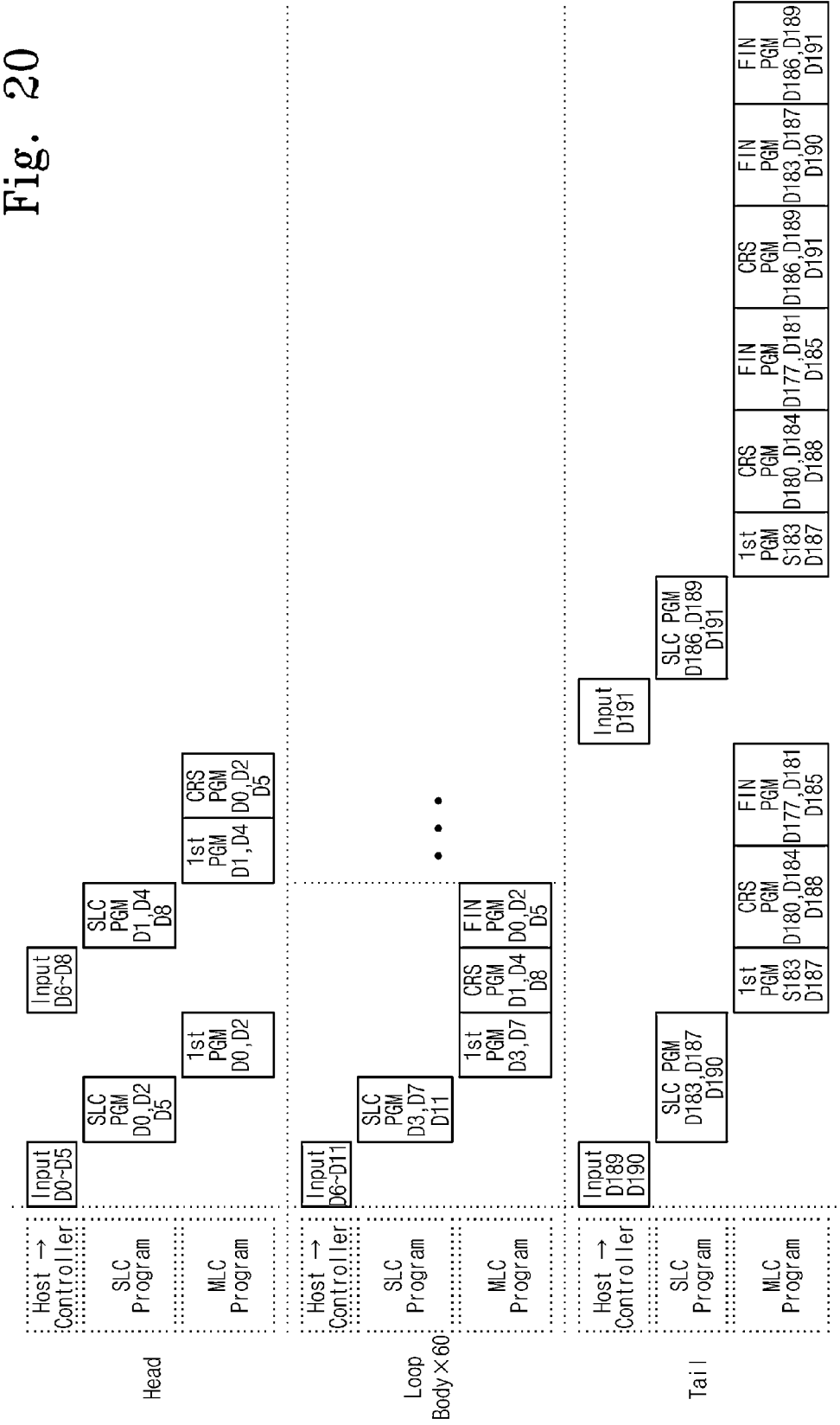
FIG. 20 is a diagram showing an exemplary data flow of a program operation of a data storage system to which a page interleave technique described in FIG. 11 and an address scramble technique described in FIG. 13 are applied.

FIG. 20 is a diagram showing an example of a data flow at a program operation of a data storage system to which a page interleave technique described in connection with FIG. 11 and an address scramble technique described in connection with FIG. 13 are applied. A program operation of a data storage system according to another embodiment of the inventive concepts will be more fully described below.

In order to simplify the description, it is assumed that each memory block includes 64 word lines WL0 to WL63 and that each memory cell stores 3-bit data. With this assumption, 3 pages are stored in the memory cells of each word line, and 192 pages are stored in each memory block. A program operation of a data storage system is described to which a page interleave technique described in connection with FIG. 11 is applied, under the assumption that an address scramble technique described in connection with FIG. 13 is applied.

Referring to FIG. 20, data is transferred to a memory controller 200 from a host 300. Since a page interleave technique is used, the memory controller 200 waits until data to be stored in a word line WL0, that is, 3-page data D0, D2, and D5 is stored. Once data to be stored in a word line WL0, that is, 4-page data D0, D2, and D5 is stored in a buffer memory 201, data to be stored in a word line WL0, that is, 3-page data D0, D2, and D5 is stored sequentially in the first region 101 of a multi-bit memory device 100 according to control of the memory controller 200. As described above, the data is stored in the first region 101 through a single-bit/SLC program operation. Then, a 1-step program operation for a word line WL0 is carried out depending upon the D0 and D2 data stored in the first region 101. When page data D6 to D8 is received to the memory controller 200 from the host 300, data to be stored in a word line WL1, that is, 3-page data D1, D4, and D8 is stored sequentially in the first region 101 of the multi-bit memory device 100 according to control of the memory controller 200. A 1-step program operation for a word line WL1 and a coarse program operation for the word line WL0 are carried out sequentially depending upon the D1 and D4 data and the D0, D2, and D5 data stored in the first region 101.

When page data D9 to D11 is received to the memory controller 200 from the host 300, data to be stored in the word line WL2, that is, 3-page data D3, D7, and D11 is stored sequentially in the first region 101 of the multi-bit memory device 100 according to control of the memory controller 200. A 1-step program operation for a word line WL2, a coarse program operation for the word line WL1, and a fine program operation for the word line WL0 are carried out sequentially depending upon data stored in the first region 101. An operating pattern carried out when data D9 to D11 is received is repeated until data D189 is stored in the buffer memory 201.

When page data D189 and D190 is stored in the buffer memory 201 of the memory controller 200, data to be stored in the word line WL62, that is, 3-page data D183, D187, and D190 is stored sequentially in the first region 101 of the multi-bit memory device 100 according to control of the memory controller 200. Then, a 1-step program operation for a word line WL62, a coarse program operation for the word line WL61, and a fine program operation for the word line WL60 are carried out sequentially depending upon data stored in the first region 101.

If data D191 is stored in the buffer memory 201 of the memory controller 200, data to be stored at a word line WL62, that is, 3-page data D186, D189, and D191 is stored sequentially in the first region 101 of the multi-bit memory device 100 according to control of the memory controller 200. Then, the 1-step program operation for the word line WL63, the coarse program operation for the word line WL62, the fine program operation for the word line WL61, the fine program operation for the word line WL62, and the fine program operation for the word line WL63 may be sequentially performed according to data stored in the first region 101.

FIG. 21 is a diagram showing another address scramble technique of a multi-bit memory device in which 4-bit data is stored in a memory cell and a reprogram method is used.

An address scramble technique illustrated in FIG. 21 may be applied to a multi-bit memory device storing 4-bit data per cell. A data storage system using the address scramble technique illustrated in FIG. 21 may operate in the same manner as that described above. For example, when data of a minimum program unit on the first region 101 is stored in a buffer memory 201, a memory controller 200 may control a multi-bit memory device 100 such that data stored in the buffer memory 201 is programmed in the first region 101. Likewise, the memory controller 200 may determine whether data of a minimum program unit on the second region 102 is prepared in the first region 101 and control the multi-bit memory device 100 such that a 1-step program operation, a coarse program operation, and a fine program operation are executed according to the determination. Such operations may be made according to program patterns in table 1 based on page address information.

FIGS. 22A to 22D are diagrams for describing various combinations on the first and second regions of a multi-bit memory device according to an exemplary embodiment of the inventive concepts. In figures, "BP" denotes buffer programming on the first region 101, and "MP" denotes main programming on the second region 102.

As described above, a multi-bit memory device 100 may include the first region 101 and the second region 102. Herein, the first and second regions 101 and 102 may constitute a memory cell array of the multi-bit memory device 100. Although not illustrated in figures, the memory cell array may include further regions such as a meta region, a reserved region, and the like. It is well understood that regions of the memory cell array are divided logically, not physically. This means that such regions of the memory cell array are defined according to address mapping of a memory controller 200.

Figure 22A:
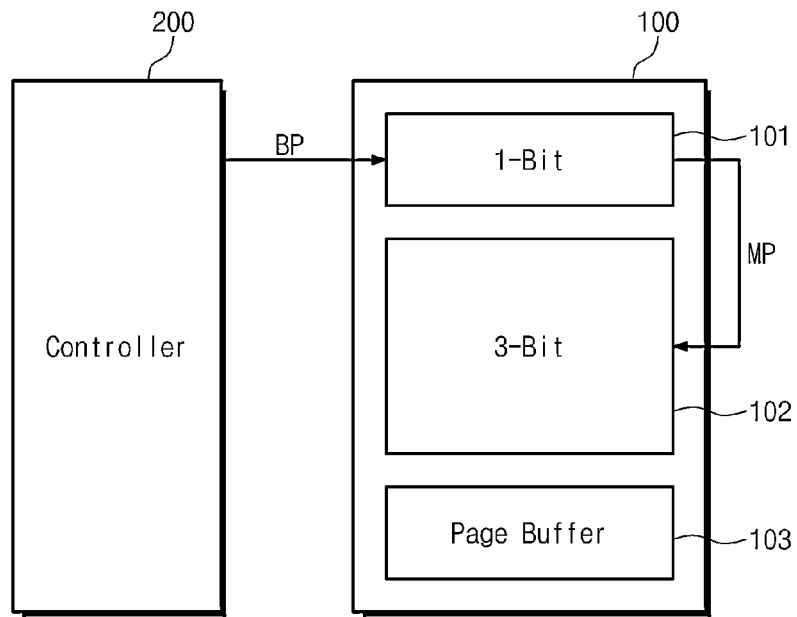
FIGS. 22A to 22D are diagrams for describing various combinations on the first and second regions of a multi-bit memory device according to an exemplary embodiment of the inventive concepts.

Referring to FIG. 22A, in the case of a multi-bit memory device which stores 3-bit data per cell, the first region 101 is formed of memory cells each storing 1-bit data, and the second region 102 is formed of memory cells each storing 3-bit data. In this case, buffer programming may be executed according to an SLC program technique, and main programming may be made according to the above-described MLC program technique.

Figure 22B:
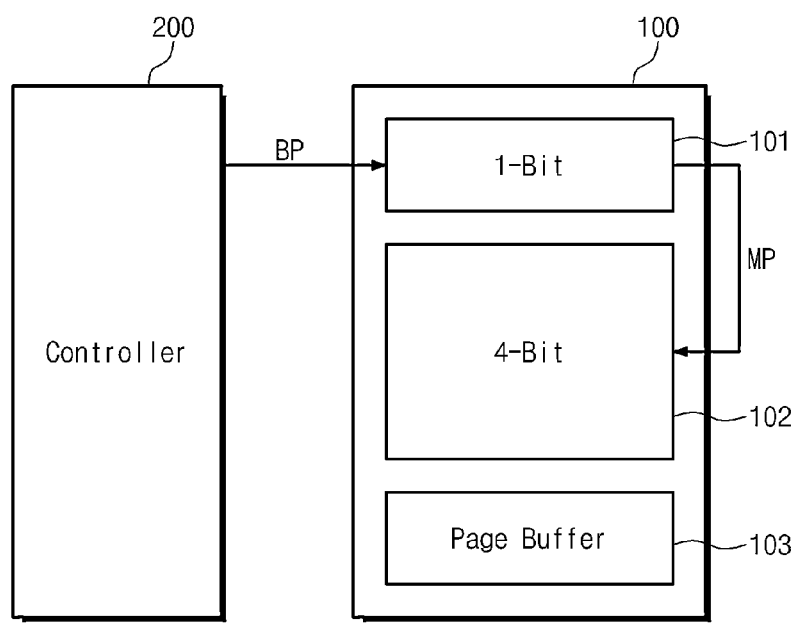

Referring to FIG. 22B, in the case of a multi-bit memory device which stores 4-bit data per cell, the first region 101 is formed of memory cells each storing 1-bit data, and the second region 102 is formed of memory cells each storing 4-bit data. In this case, buffer programming may be executed according to an SLC program technique, and main programming may be made according to the above-described MLC program technique.

Figure 22C:
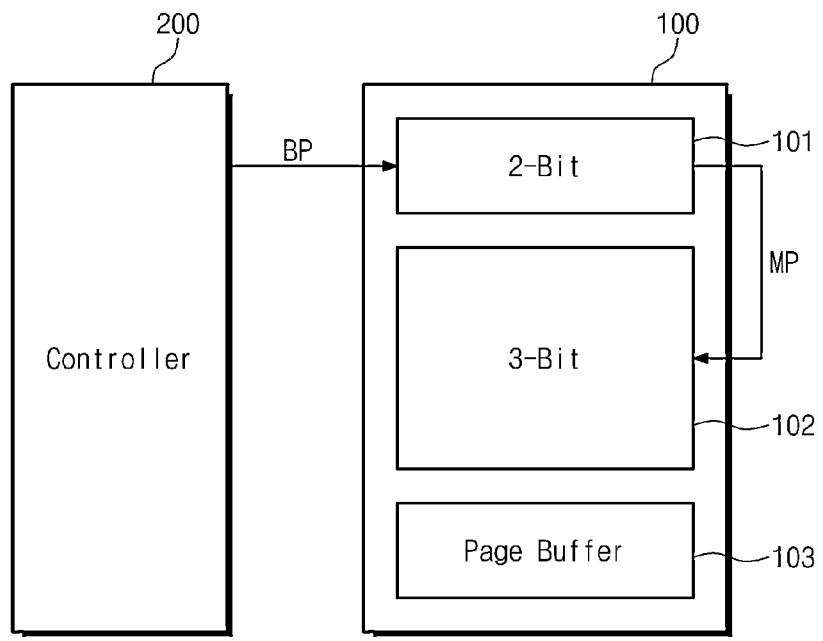

Referring to FIG. 22C, in the case of a multi-bit memory device which stores 3-bit data per cell, the first region 101 is formed of memory cells each storing 2-bit data, and the second region 102 is formed of memory cells each storing 3-bit data. In this case, buffer programming may be executed according to the above-described or conventional MLC program technique, and main programming may be made according to the above-described MLC program technique (for example, a reprogram technique).

Figure 22D:
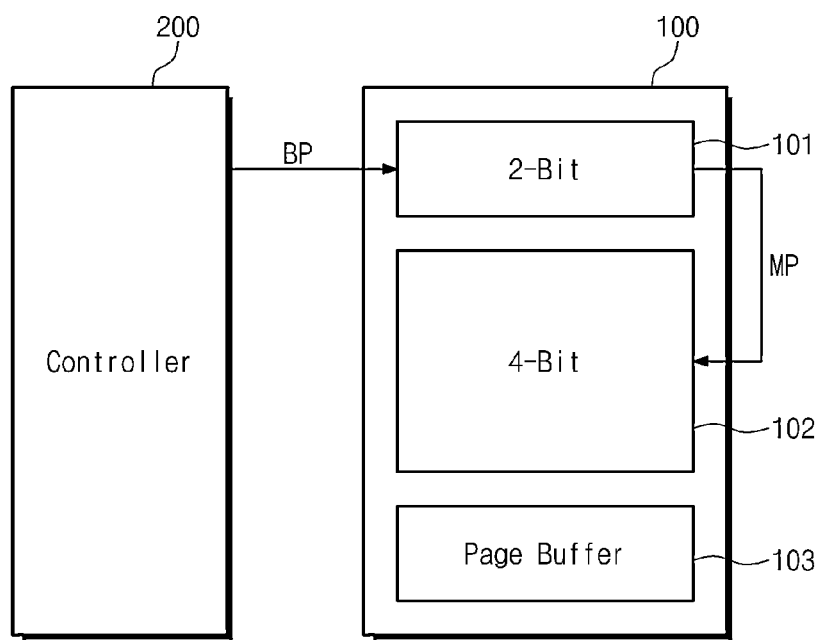

Referring to FIG. 22D, in the case of a multi-bit memory device which stores 4-bit data per cell, the first region 101 is formed of memory cells each storing 2-bit data, and the second region 102 is formed of memory cells each storing 4-bit data. In this case, buffer programming may be executed according to the above-described or conventional MLC program technique, and main programming may be made according to the above-described MLC program technique (for example, a reprogram technique).

It will be understood that the inventive concepts are not limited to the specific examples of defining of the first and second regions 101 and 102 as illustrated in FIGS. 22A to 22D. As another non-limiting example, if a storage media included in a data storage device is formed of a plurality of multi-bit memory devices, the first and second regions 101 and 102 can be defined with respect to the respective multi-bit memory devices. Alternatively, the first region 101 can be defined with respect to any one of the multi-bit memory devices. Alternatively, any one multi-bit memory device can be defined as the first region 101.

Figure 23:
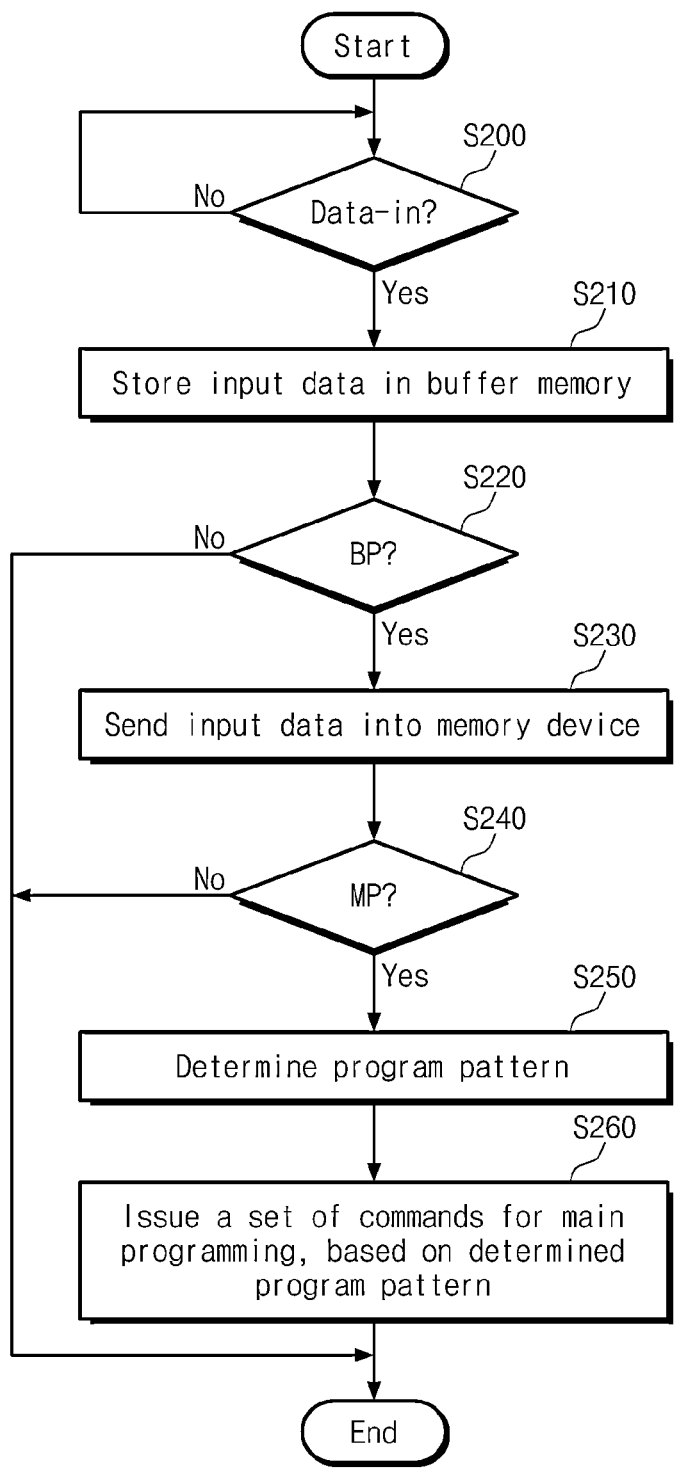
FIG. 23 is a flow chart for describing an operation of a memory controller according to an exemplary embodiment of the inventive concepts.

FIG. 23 is a flow chart for describing an operation of a memory controller according to an exemplary embodiment of the inventive concepts. An operation of a memory controller according to an exemplary embodiment of the inventive concept will be more fully described below.

In step S200, a memory controller 200 may determine whether data is received. If no data is received, the step S200 is repeated. If data is received, the procedure goes to step S210, in which received data is stored in a buffer memory 201 of a memory controller 200. In step S220, the memory controller 200 may determine whether a buffer program operation (or, a Buffer Program (BP) operation) is requested. If the BP operation is not required, the procedure is ended.

If the BP operation is required, the procedures goes to step S230, in which data stored in the buffer memory 201, that is, data of a minimum program unit on the first region 101 may be sent to a multi-bit memory device 100. This means that data of a minimum program unit on the first region 101 is stored in the first region 101 of the multi-bit memory device 100. In step S240, the memory controller 200 may judge whether a Main Program (MP) operation is required (or, whether the BP operation accompanies the MP operation). This determination may be made according to page address information as described above.

If the MP operation is not required, the procedure is ended. On the other hand, if the MP operation is required, the procedure goes to step S250, in which there is determined a program pattern associated with the MP operation. A program pattern of the MP operation following the BP operation may be formed of a 1-step program operation, a coarse program operation, a set of coarse and fine program operations, and a set of coarse, fine, and fine program operations. In step S260, the memory controller 200 may issue a set of commands for the main programming based on the determined program pattern. Such commands may include a mode switching command, an SLC read command, a dump command, a program confirm command, and the like as described in connection with FIGS. 16 and 18. Thereafter, the procedure is ended.

Figure 24:
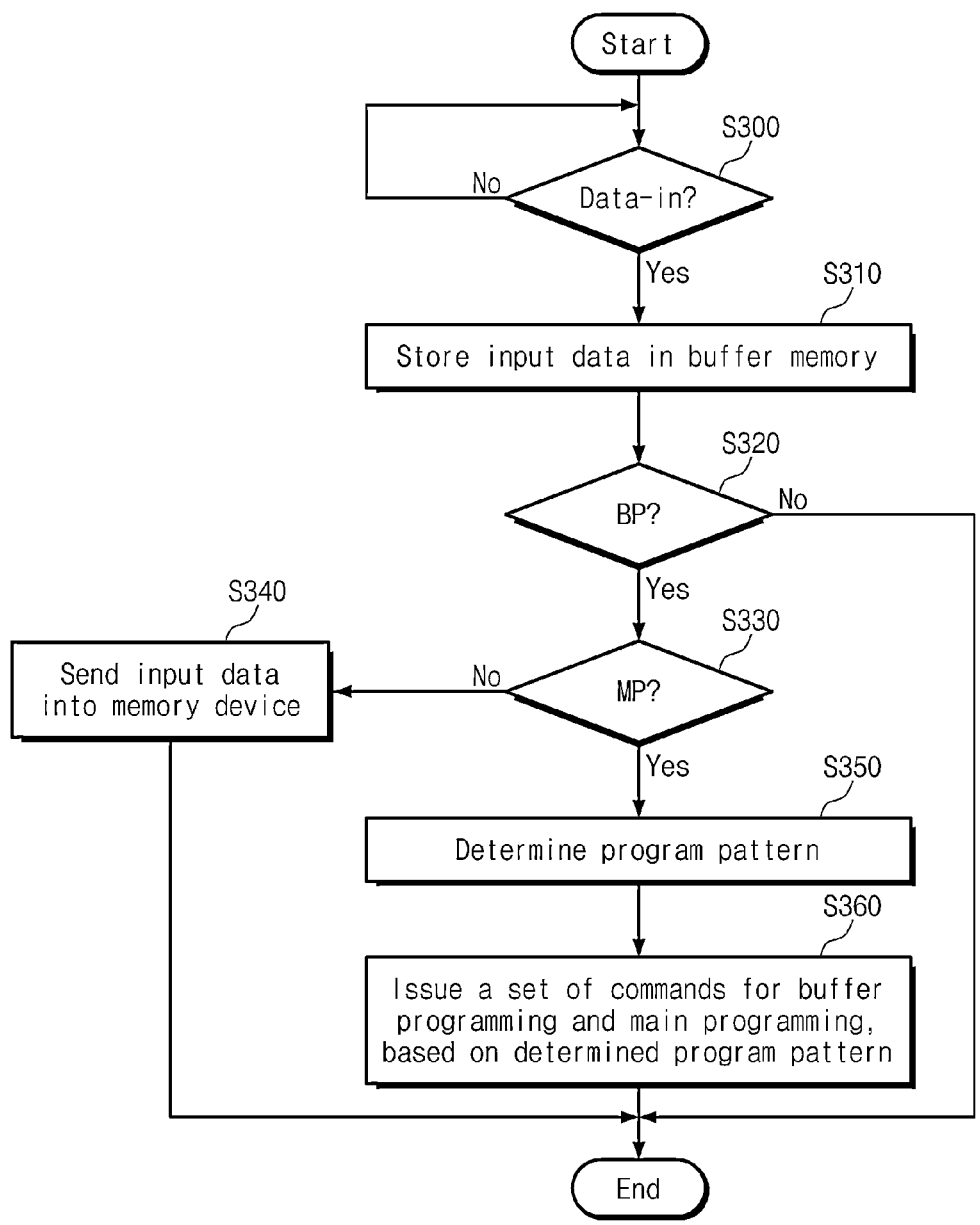
FIG. 24 is a flow chart for describing an operation of a memory controller according to another exemplary embodiment of the inventive concepts.

FIG. 24 is a flow chart for describing an operation of a memory controller according to another exemplary embodiment of the inventive concepts. An operation of a memory controller according to another exemplary embodiment of the inventive concept will be more fully described below.

In step S300, a memory controller 200 may determine whether data is received. If no data is received, the step S300 is repeated. If data is received, the procedure goes to step S310, in which received data is stored in a buffer memory 201 of a memory controller 200. In step S320, the memory controller 200 may determine whether a buffer program operation (or, a Buffer Program (BP) operation) is requested. If the BP operation is not required, the procedure is ended.

If the BP operation is required, the procedure goes to step S330, in which the memory controller 200 may determine whether a Main Program (MP) operation is required (or, whether the BP operation accompanies the MP operation). This determination may be made according to page address information as described above. If the MP operation is not required, the procedure goes to step S340, in which data stored in the buffer memory 201, that is, data of a minimum program unit on the first region 101 may be sent to a multi-bit memory device 100. This means that data of a minimum program unit on the first region 101 is stored in the first region 101 of the multi-bit memory device 100.

On the other hand, if the MP operation is required, the procedure goes to step S350, in which there is determined a program pattern associated with the MP operation. The determined program pattern may be any one of program patterns described in the table 1. However, it is understood that the program pattern is changed when the interleave technique is used. In step S360, the memory controller may issue a set of commands for buffer and main programming based on the determined program pattern. A command for the buffer programming includes an SLC program command, and commands for the main programming include a mode switching command, an SLC read command, a dump command, a program confirm command, and the like as described in FIGS. 16 and 18. Thereafter, the procedure is ended.

In an exemplary embodiment, data for the buffer programming may be sent to the multi-bit memory device 100 following the SLC program command and prior to commands for the main programming.

Figure 25:
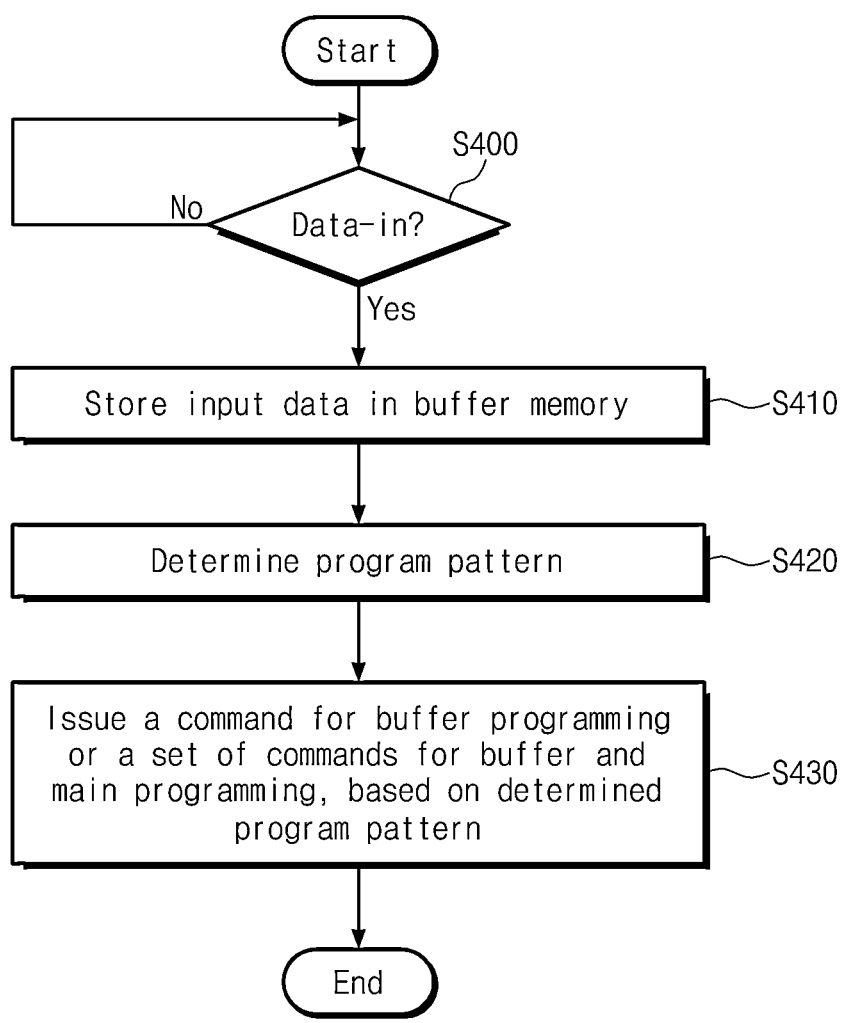
FIG. 25 is a flow chart for describing an operation of a memory controller according to still another exemplary embodiment of the inventive concepts.

FIG. 25 is a flow chart for describing an operation of a memory controller according to still another exemplary embodiment of the inventive concepts. An operation of a memory controller according to still another exemplary embodiment of the inventive concept will be more fully described below.

In step S400, a memory controller 200 may determine whether data is received. If no data is received, the step S400 is repeated. If data is received, the procedure goes to step S410, in which received data is stored in a buffer memory 201 of a memory controller 200. In step S420, the memory controller 200 may determine a program pattern. The program pattern may be any one of program patterns described in the table 1. However, it is understood that a program pattern is changed when the interleave technique is used. In step S430, the memory controller 200 may issue a command for buffer programming or a set of commands for buffer and main programming based on the determined program pattern. A command for the buffer programming includes an SLC program command, and commands for the main programming include a mode switching command, an SLC read command, a dump command, a program confirm command, and the like as described in FIGS. 16 and 18. Thereafter, the procedure is ended.

In an exemplary embodiment, data for the buffer programming may be sent to a multi-bit memory device 100 following an SLC program command and prior to commands for the main programming. The program pattern may be determined to include a command for the buffer programming or to exclude a command for the buffer programming.

In an exemplary embodiment, a command (for example, DAh in FIG. 16) informing an SLC mode may be provided to the multi-bit memory device 100. Likewise, after a buffer program operation is executed, a command (for example, DFh in FIG. 16) indicative of an end of the SLC mode may be provided to the multi-bit memory device 100.

In an exemplary embodiment, the first and second regions 101 and 102 may be defined by the memory controller 200 prior to operations described in FIGS. 23 to 25. After the first and second regions 101 and 102 are defined, buffer and main program operations on data provided from a host 300 may be made according to the above-described technique.

In an exemplary embodiment, a program pattern may be variously defined. For example, a program pattern may be defined with respect to a buffer program operation and a main program operation, respectively. Alternatively, a program pattern may be defined together with respect to a buffer program operation and a main program operation. The main program operation may include a set of program operations such as a 1-step program operation, a coarse program operation, coarse and fine program operations, coarse, fine, and fine program operations, and the like.

Figure 26:
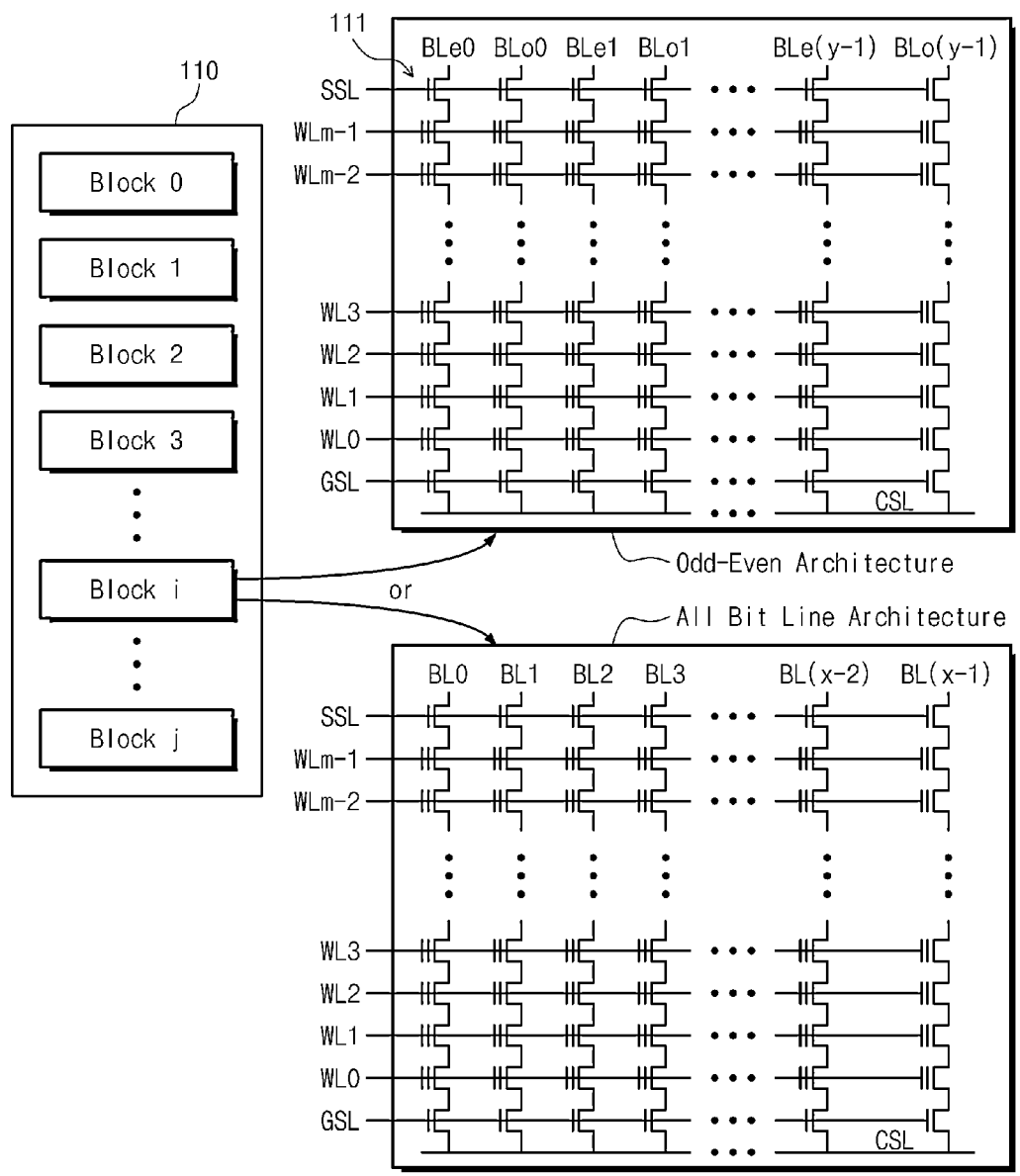
FIG. 26 illustrates a diagram showing a memory cell array having an all-bit-line memory architecture or an odd-even memory architecture.

FIG. 26 is a diagram showing a memory cell array 110 having an all bit line memory architecture or an odd-even memory architecture. Exemplary structures of a memory array 110 included in a multi-bit memory device 100 illustrated in FIG. 2 will be described. As one example, a NAND flash memory device including a memory cell array 110 partitioned into a plurality of blocks 0~j will now be described. For example, the memory cell array 110 may be partitioned into 1,023 blocks. The data stored in each block may be simultaneously erased. In one embodiment, the memory block is the minimum unit of storage elements that are simultaneously erased. Each memory block, for example, has columns each corresponding to bit lines (e.g., bit lines of 1 KB).

In one embodiment referred to as the all bit line (ABL) architecture, all the bit lines BL0~BL(x−1) of a memory block are capable of being simultaneously selected during read and program operations. Storage elements in a common word line WL0~WLm−1 and connected to all bit lines are capable of being programmed at the same time.

In an exemplary embodiment, a plurality of storage elements in the same column is connected in series to form a NAND string 111. One end of the NAND string 111 is connected to a corresponding bit line via a select transistor which is controlled by a string select line SSL, the other end is connected to a common source line CSL via a select transistor which is controlled by a ground select line GSL.

Still referring to FIG. 26, in another embodiment referred to as the odd-even architecture, bit lines are divided into even bit lines (BLe0~BLe(y−1)) and odd bit lines (BLo0~BLo(y−1)). In the odd/even bit line architecture, storage elements in a common word line and connected to the odd bit lines are programmed at the first program time, while storage elements in the common word line and connected to even bit lines are programmed at the second program time. Data is capable of being programmed and read into and from different blocks. Such operations are capable of being performed at the same time.

A flash memory device forming a multi-bit memory device according to an exemplary embodiment of the inventive concepts is a non-volatile memory device which retains data even under a power-off condition. With an increase in popularity of mobile devices such as cellular phones, PDA digital cameras, portable gate consoles, and MP3P devices, a flash memory device is widely used as not only data storage but also code storage. The flash memory device, further, is capable of being used various other applications, including high-definition televisions (HDTVs), digital videos devices (DVDs), routers, and global satellite positioning (GSP) devices.

Figure 27:
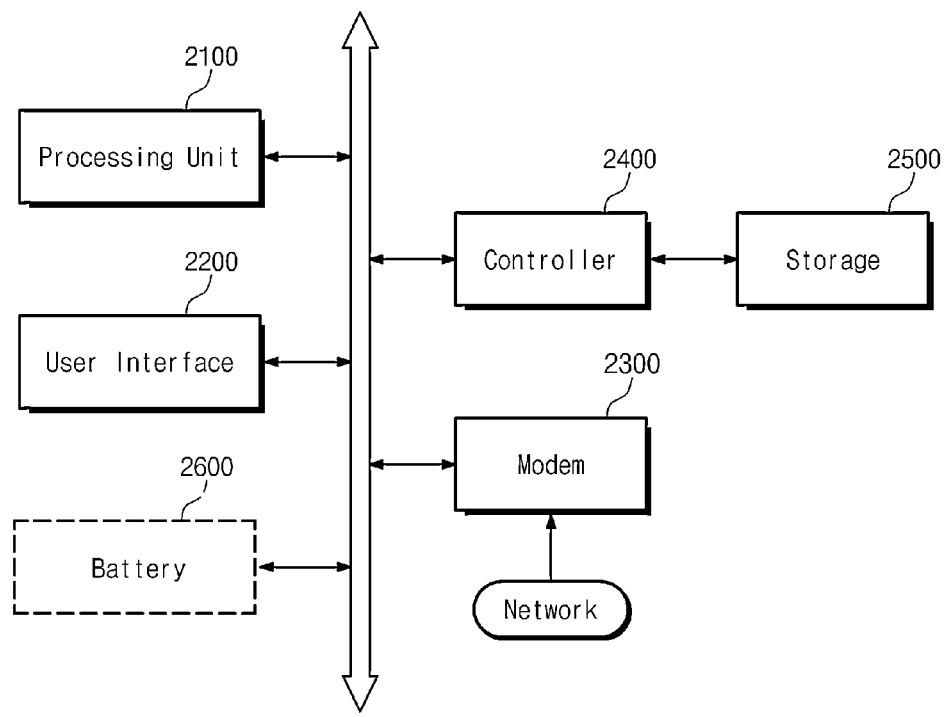
FIG. 27 is a block diagram showing a computing system according to an exemplary embodiment of the inventive concepts.

FIG. 27 is a block diagram showing a computing system according to an exemplary embodiment of the inventive concepts.

A computing system of this example includes a microprocessor 2100, a user interface 2200, a modem 2300 such as a baseband chipset, a memory controller 2400, and a multi-bit memory device 2500 as a storage media. The modem 2300 is for communicating with an external network (Network). The multi-bit memory device 2500 may be configured in the same manner as that illustrated in previously described FIG. 2. As a result, a size of a buffer memory included in the memory controller 2400 can be reduced. N-bit data (N being an integer of 1 or more) processed and/or to-be-processed by the microprocessor 2100 is stored in the multi-bit memory device 2500 through the memory controller 2400. In the event that the computing system is a mobile device, a battery 2600 is further included in the computing system to supply an operating voltage thereto. Although not illustrated in FIG. 27, the computing system further comprises an application chipset, a camera image processor (CIS), a mobile DRAM, and the like.

Figure 28:
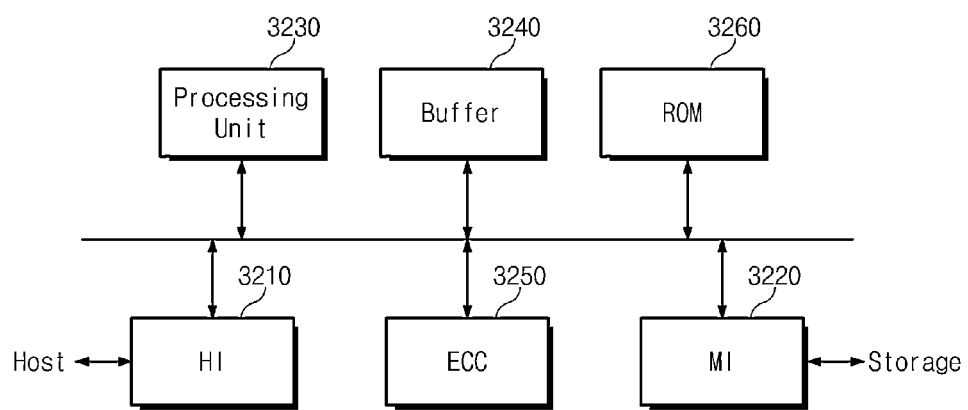
FIG. 28 is a block diagram showing a memory controller according to an exemplary embodiment of the inventive concepts.

FIG. 28 is a block diagram showing a memory controller according to an exemplary embodiment of the inventive concepts.

Referring to FIG. 28, a controller may be configured to store data in storage media and read data from the storage media. The controller may include a first interface (HI) 3210, a second interface (MI) 3220, a processing unit 3230, a buffer memory 3240, an error control unit 3250, and ROM 3260. The memory controller in FIG. 28 may, for example, be applied to a system illustrated in FIG. 2 or 27.

The first interface (HI) 3120 may be configured to interface with an external device (for example, a Host), and the second interface (MI) 3220 may be configured to interface with the storage media (Storage) such as the storage media 3100 illustrated in FIG. 2 or 27. The processing unit 3230 may be configured to control an overall operation of the controller 3200. The processing unit 3230 may be configured to operate firmware such as a Flash Translation Layer (FTL) stored in the ROM 3260. The buffer memory 3240 may be used to temporarily store data to be written in the storage media 3100 or data read out from the storage media 3100. The ECC unit 3250 may be configured to encode data to be stored in the storage media 3100 and to decode data read from the storage media 3100.

In an exemplary embodiment, a memory controller may be configured to issue commands sequentially according to command sequences described in connection with FIGS. 16 and 18. Alternatively, the memory controller may be configured to issue a command set representative of the above-described command pattern.

Figure 29:
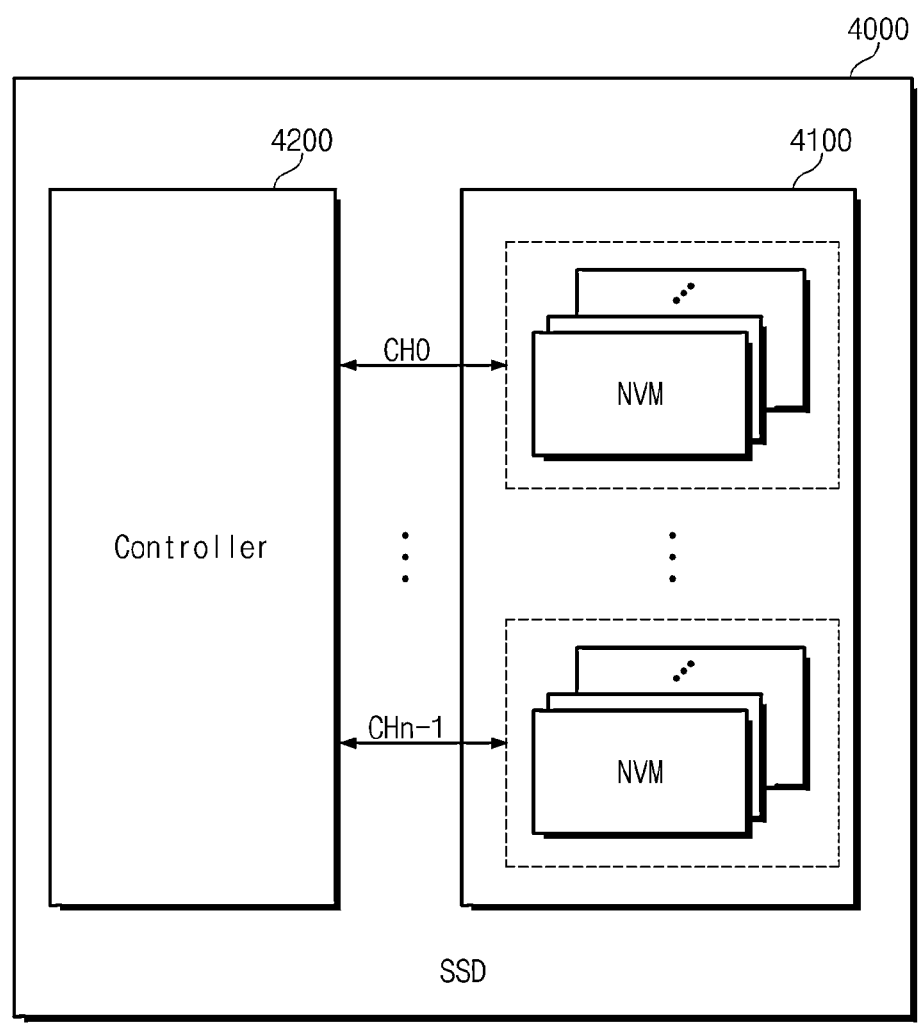
FIG. 29 is a block diagram showing a solid state drive according to exemplary embodiments of the inventive concepts.

FIG. 29 is a block diagram showing an example of a solid state drive according to exemplary embodiments of the inventive concepts.

Referring to FIG. 29, a solid state drive (SSD) 4000 may include a storage media 4100 and a controller 4200. The storage media 4100 is connected with the controller 4200 via a plurality of channels, each of which is commonly connected with a plurality of non-volatile memories. Each non-volatile memory device may be formed of a memory such as that described in connection with FIG. 2. The controller 4200 may be configured to control the storage media 4100 according to any one of programming techniques described with reference to FIGS. 3 to 21. As a result, a size of a buffer memory included in the controller 4200 can be reduced.

Figure 30:
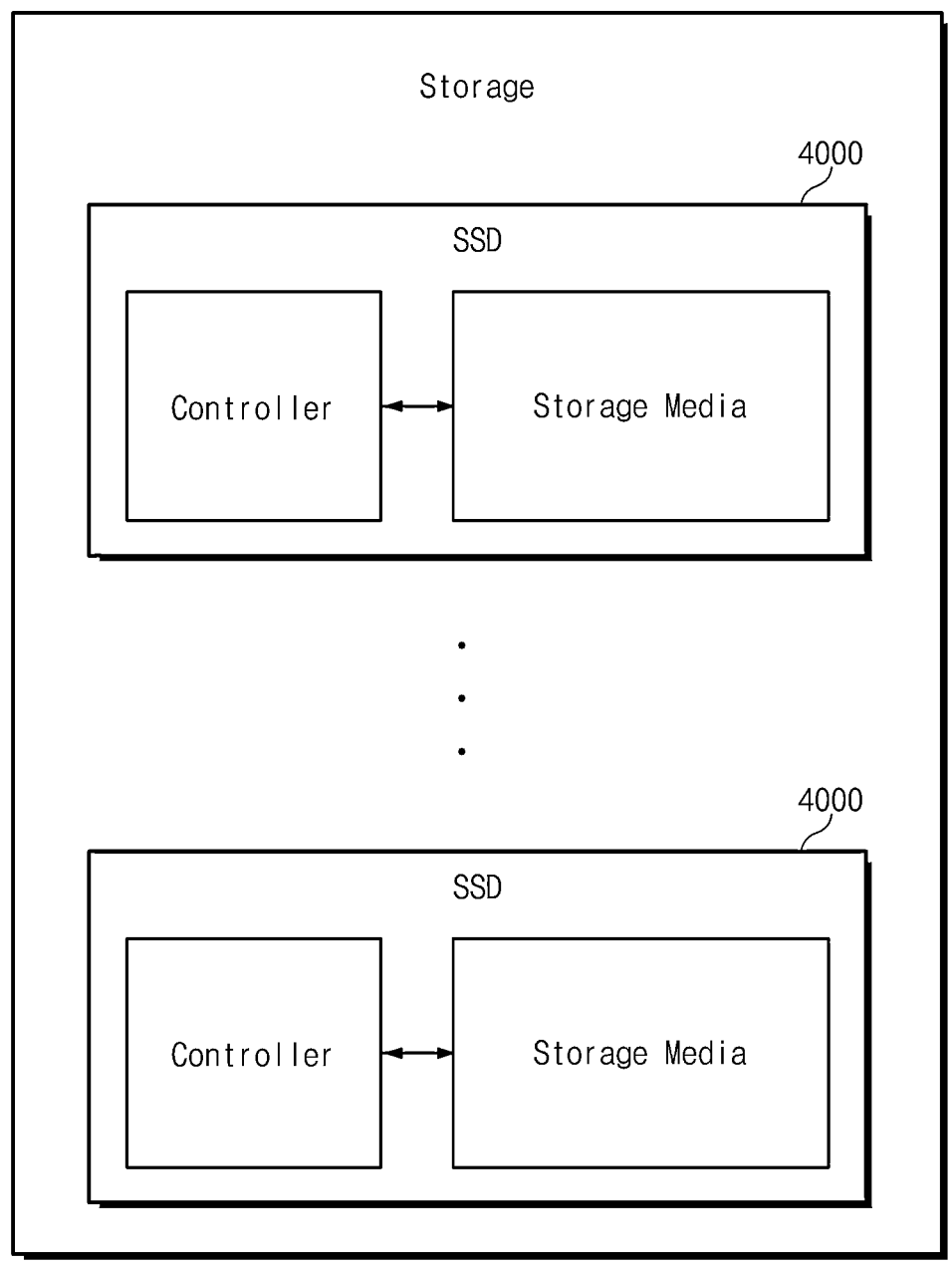
FIG. 30 is a block diagram showing an example of a storage device using a solid state drive in FIG. 29.
Figure 31:
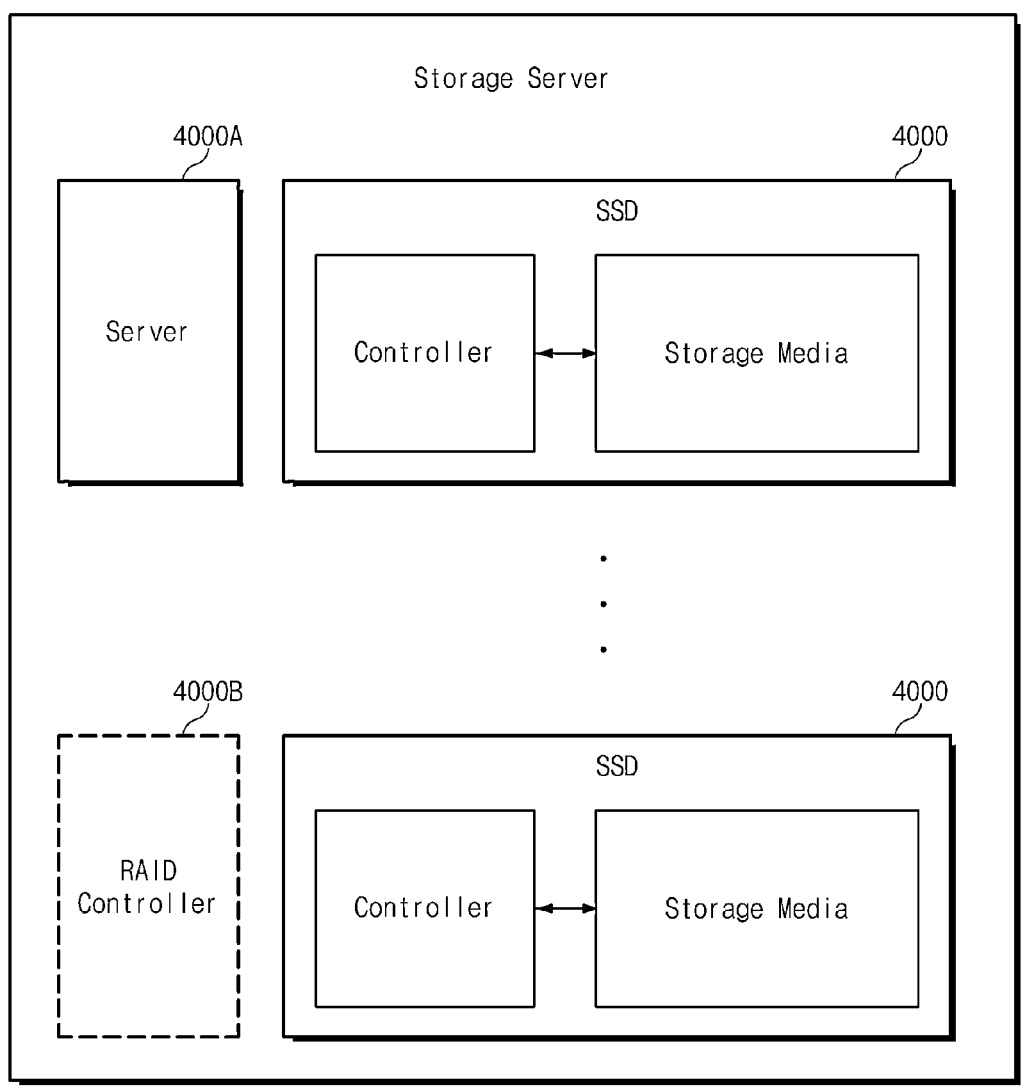
FIG. 31 is a block diagram showing an example of a storage server using a solid state drive in FIG. 29.

FIG. 30 is a block diagram showing an example of a data storage using a solid state drive described in connection with FIG. 29, and FIG. 31 is a block diagram showing an example of a storage server using a solid state drive described in connection with FIG. 29.

An SSD 4000 according to an exemplary embodiment of the inventive concept may be used to form various types of data storage devices. For example, the data storage (Storage) of FIG. 30 includes a plurality of solid state drives 4000 which are configured in the same manner as described above in connection with FIG. 29. As another example, the storage server (Storage Server) of FIG. 31 includes a plurality of solid state drives 4000, which are configured in the same manner as described above in connection with FIG. 29, and a server 4000A. In addition, the storage server may also include a redundant array of independent discs (RAID) controller 4000B.

Figure 32:
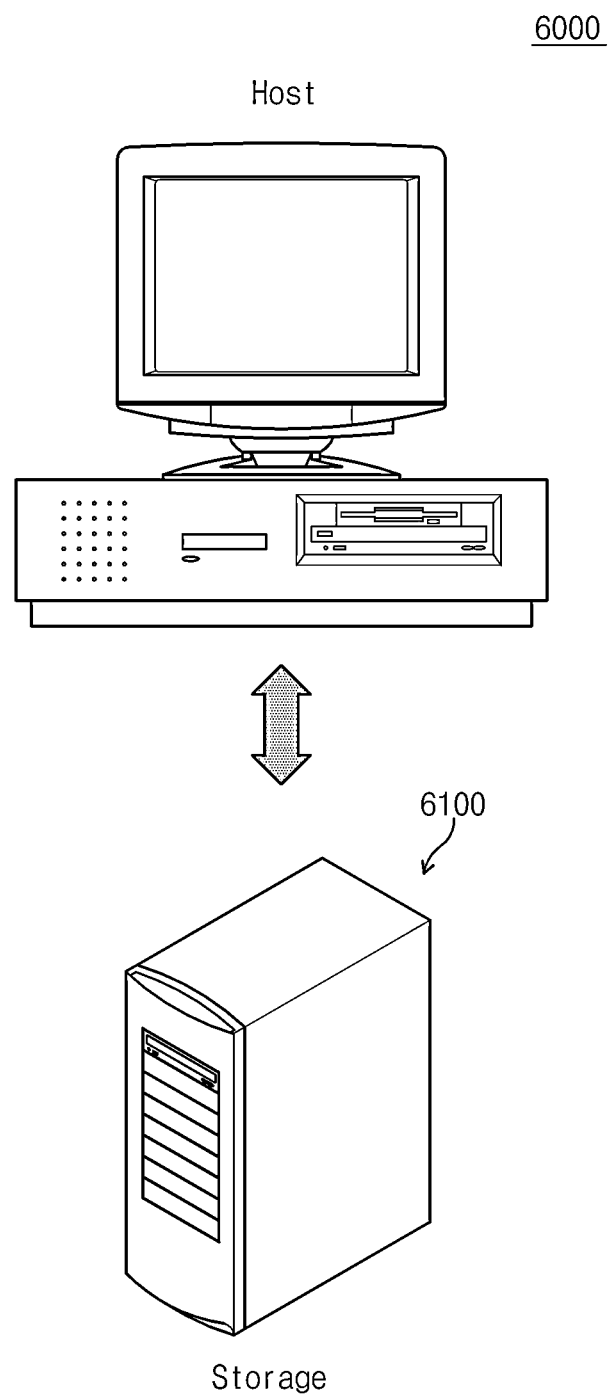
FIGS. 32 to 34 are diagrams showing examples of systems to which a data storage device according to exemplary embodiments of the inventive concepts is applied.
Figure 33:
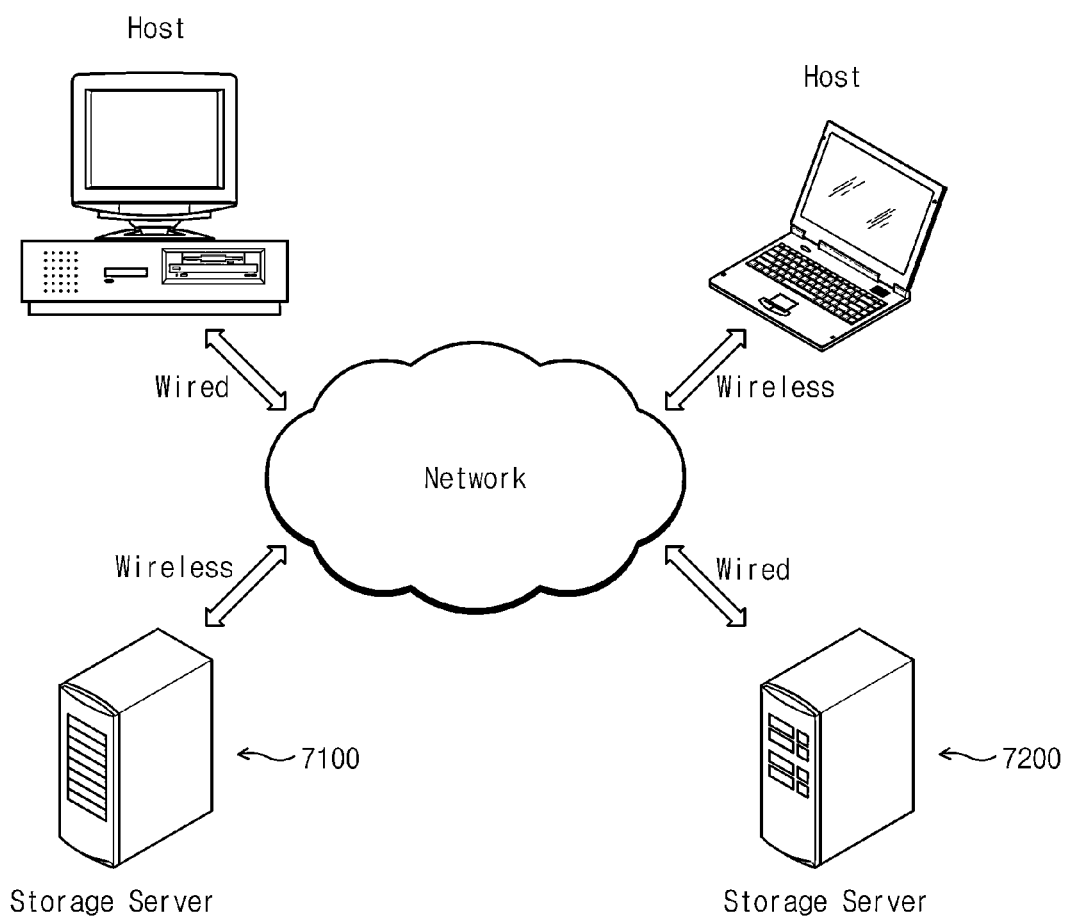
Figure 34:
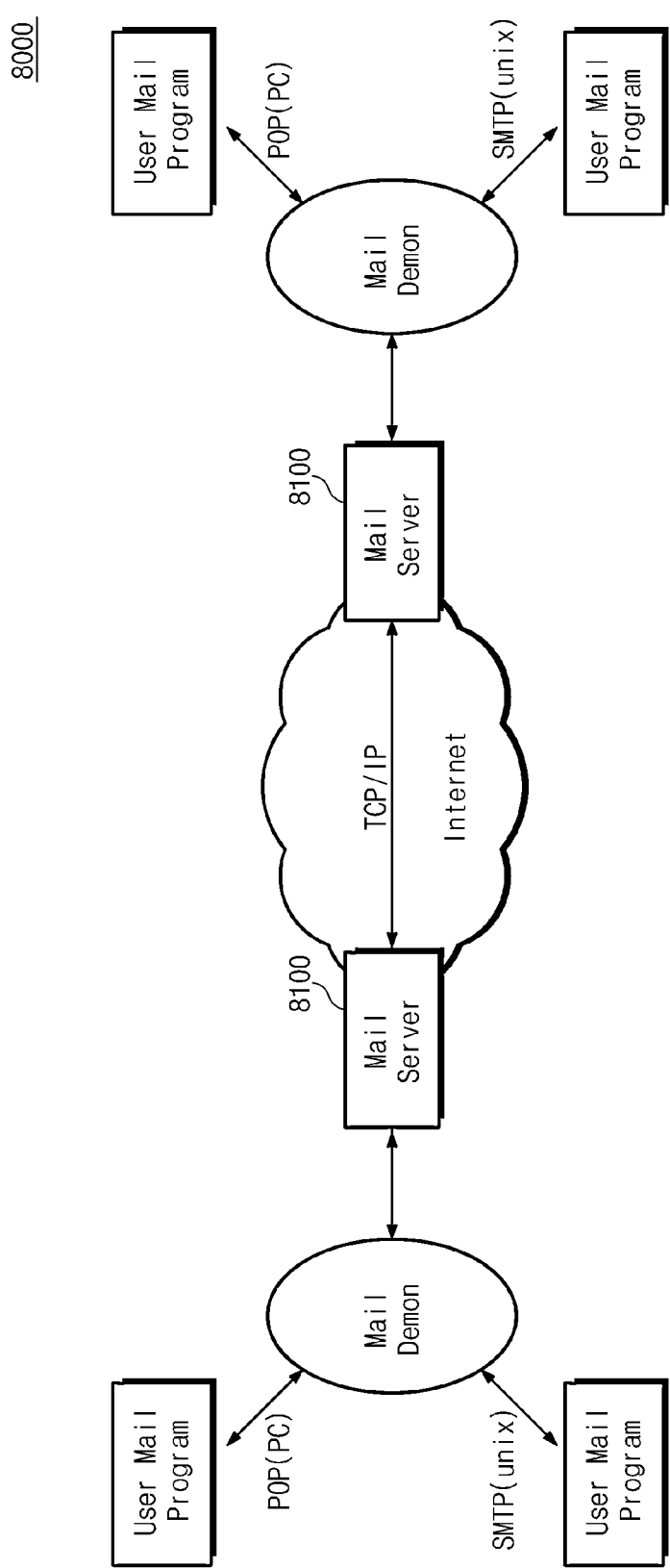

FIGS. 32 to 34 are diagrams showing examples of systems to which a data storage device according to exemplary embodiments of the inventive concepts may be applied.

FIG. 32 illustrates an example of a system 6000 in which a data storage 6100 includes a solid state drive including a data storage device formed of a memory controller and a multi-bit memory device according to exemplary embodiments of the inventive concepts. Here, the storage 6100 which communicates with a host (Host) by wired or wireless communication.

FIG. 33 illustrates an example of a system 7000 in which storage servers 7100 and 7200 include a solid state drive including a data storage device according to exemplary embodiments of the inventive concepts. Here, the storage servers 7100 and 7200 communicate with multiple hosts (Host) by wired or wireless communication.

FIG. 34 illustrates an example of a system 8000 in which mail servers 8100 and 8100 include a solid state drive including a data storage device according to exemplary embodiments of the inventive concepts. Here, the mail servers 8100 communicate over the internet using TCP/IP protocols. In this example, each mail server 8100 services user mail programs via mail demon interface and point-of-presence (POP) and/or simple mail transfer protocol (SMPT) protocols.

Figure 35:
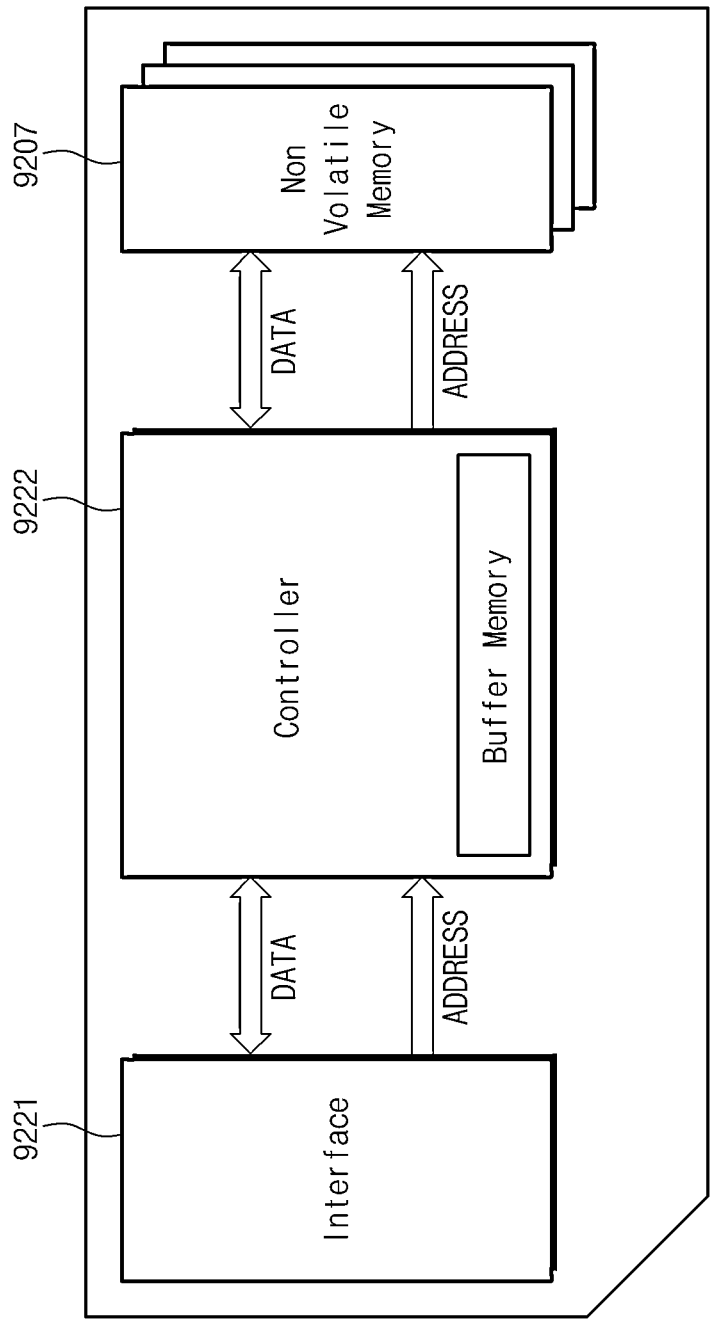
FIG. 35 is a block diagram illustrating an example of a memory card according to embodiments of the inventive concepts.

FIG. 35 is a block diagram illustrating a memory card according to embodiments of the inventive concepts. Non-limiting examples of the memory card include a multimedia card (MMC), a secure digital (SD) card, a multiuse card, a micro-SD card, a memory stick, a compact SD card, an identification (ID) card, a personal computer card (PCMCIA), a solid state drive (SSD) card, a chip-card, a smartcard, a universal serial bus (USB) card, or the like.

Referring to FIG. 35, the memory card may include an interface circuit 9221 for interfacing with an external device, a controller 9222 including a buffer memory and controlling an operation of the memory card, and at least one non-volatile memory device 9207 according to embodiments of the inventive concepts. The controller 9222 may be a processor which is configured to control write and read operations of the non-volatile memory device 9207. In particular, the controller 9222 may be coupled with the non-volatile memory device 9207 and the interface circuit 2221 via a data bus and an address bus. The controller 9222 and the non-volatile memory device 9207 may correspond to a controller 200 and a multi-bit memory device 100 described in connection with FIG. 2, respectively. The controller 9222 may be configured to control the non-volatile memory device 9207 according to any one of programming techniques described with reference to FIGS. 3 to 21. As a result, a size of a buffer memory included in the controller 9222 can be reduced.

Figure 36:
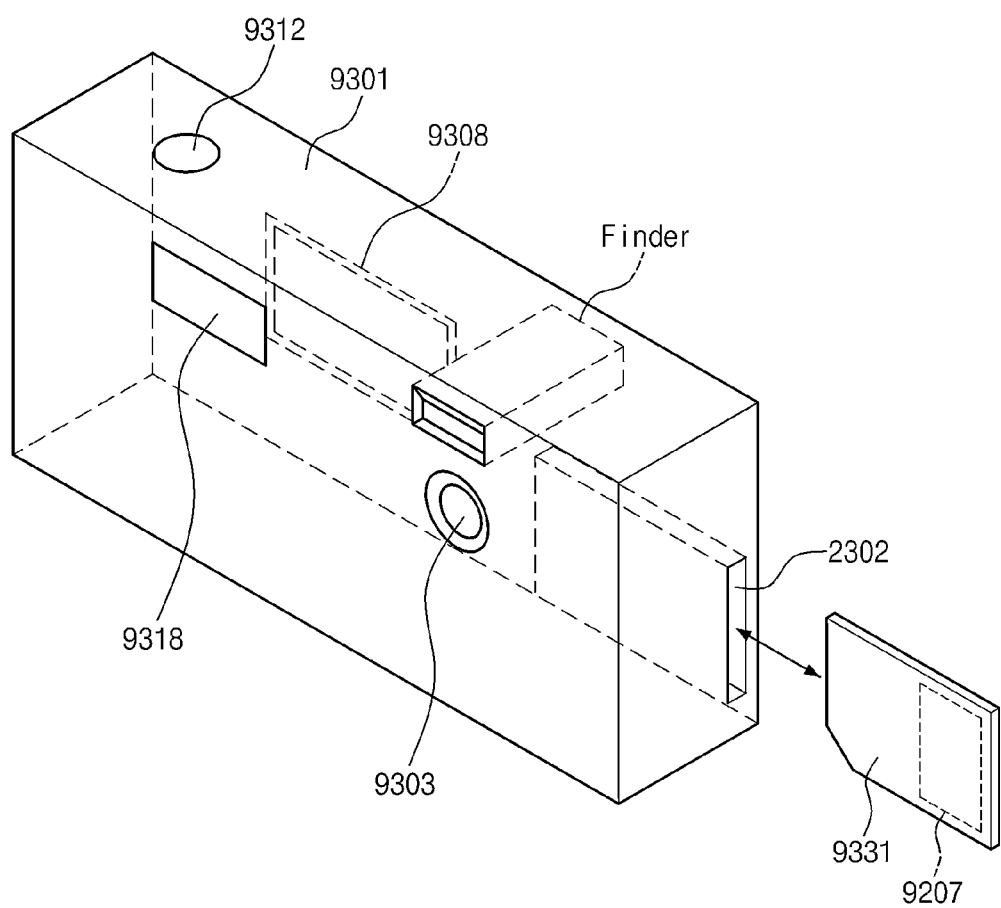
FIG. 36 is a block diagram illustrating an example of a digital still camera according to embodiments of the inventive concepts.

FIG. 36 is a block diagram illustrating an example of a digital still camera according to embodiments of the inventive concepts.

Referring to FIG. 36, a digital still camera may include a body 9301, a slot 9302, a lens 9303, a display circuit 9308, a shutter button 9312, a strobe 9318, and the like. A memory card 9331 may be inserted in the slot 9308 and include a memory controller 200 and a multi-bit memory device 100 described in connection with FIG. 2. The memory controller in the memory card 9331 may be configured to control the multi-bit memory device therein according to any one of programming techniques described with reference to FIGS. 3 to 21. As a result, a size of a buffer memory included in the memory controller can be reduced.

If the memory card 9331 is a contact type memory, an electric circuit on a circuit board may be electrically contacted with the memory card 9331 when it is inserted in the slot 9308. In the event that the memory card 9331 is a non-contact type memory card, an electric circuit on a circuit board may wirelessly communicate with the memory card 9331, for example, by radio-frequency communication.

Figure 37:
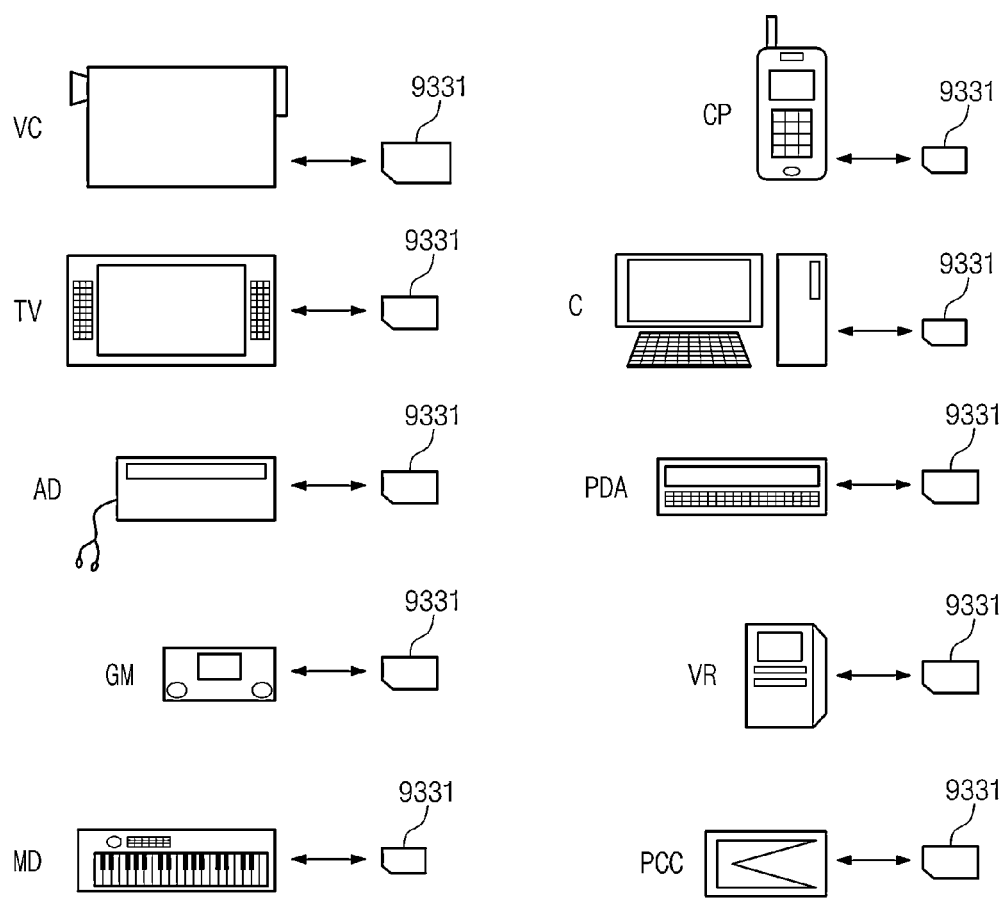
FIG. 37 is a diagram illustrating examples of various systems to which a memory card in FIG. 35 is applied.

FIG. 37 is a diagram illustrating examples of various systems to which a memory card shown in FIG. 35 may be applied.

Referring to FIG. 37, a memory card 9331 may be applied to a video camera (VC), a television (TV), an audio device (AD), a game machine (GM), an electronic music device (MD), a cellular phone (CP), a computer (C), a Personal Digital Assistant (PDA), a voice recorder (VR), a PC card (PCC), and the like.

In an exemplary embodiment of the inventive concepts, memory cells can be formed of a variable resistance memory cell. An exemplary variable resistance memory cell and a memory device including the same are disclosed in U.S. Pat. No. 7,529,124, the entirety of which is incorporated by reference herein.

In another exemplary embodiment of the inventive concepts, memory cells are formed of one of various cell structures having a charge storage layer. Non-limiting examples of cell structures having a charge storage layer include a charge trap flash structure using a charge trap layer, a stack flash structure in which arrays are stacked in a multiple layer, a source-drain free flash structure, a pin-type flash structure, and so on.

Memory devices having a charge trap flash structure as a charge storage layer are disclosed in U.S. Pat. No. 6,858,906 and U.S. Publication Nos. 2004/0169238 and 2006/0180851, the entireties of which are incorporated by reference herein. A source-drain free flash structure is disclosed in KR Patent No. 673020, the entirety of which is incorporated by reference herein.

A non-volatile memory device and/or a memory controller according to the inventive concepts may be incorporated into various types of packages. As non-limiting examples, a non-volatile memory device and/or a memory controller according to the inventive concepts may be incorporated into packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of operating a data storage system comprising a controller including a buffer memory, and a non-volatile memory including a memory cell array divided into a first region and a second region, the method comprising:
receiving first page data from the buffer memory and programming the first page data to first memory cells connected to a first word line in the first region using a buffer program operation and receiving second page data from the buffer memory and programming the second page data to second memory cells connected to a second word line different from the first word line in the first region using the buffer program operation and receiving third page data from the buffer memory and programming the third page data to third memory cells connected to a third word line different from the first and second word lines in the first region using the buffer program operation;
programming first multi-level memory cells connected to a fourth word line in the second region with at least two of the first page data, the second page data and the third page data stored in the first region using a first sequence of a main program operation; then
programming second multi-level memory cells connected to a fifth word line in the second region using the first sequence of the main program operation; and then,
programming the first multi-level memory cells with the first page data, the second page data, and the third page data stored in the first region using a second sequence of the main program operation,
wherein respective threshold voltage distributions for the first multi-bit memory cells are narrowed between the first and second sequences of the main programming operation of the first multi-level memory cells except for a threshold voltage distribution of an erase state; and then
programming the first multi-level memory cells with the first page data, the second page data, and the third page data stored in the first region using a third sequence of the main program operation,
wherein the respective threshold voltage distributions for the first multi-level memory cells are further narrowed between the second and third sequences of the main program operation of the first multi-level memory cells except for the threshold voltage distribution of the erase state.

2. The method of claim 1, wherein the first multi-level memory cells are read out only after a completion of the third sequence of the main program operation.

3. The method of claim 1, wherein the first sequence of the program operation is a 1-step program operation, the second sequence of the program operation is a coarse program operation, and the third sequence of the program operation is a fine program operation.

4. The method of claim 1, wherein the fourth and fifth word lines are directly adjacent each other.

5. A data storage system comprising:
a buffer memory;
a non-volatile memory including a memory cell array and a page buffer connected to the memory cell array; and
a controller configured to
load first, second, third, fourth and fifth page data to the buffer memory,
load at least two of the first page data, the second page data and the third page data stored in the buffer memory to the page buffer and program first multi-level memory cells connected to a first word line in the memory cell array with the at least two of the first page data, the second page data and the third page data loaded in the page buffer using a first sequence of a program operation, then
program second multi-level memory cells connected to a second word line in the memory cell array with the fourth page data and the fifth page data using another first sequence of the program operation, then
load the first page data, the second page data and the third page data stored in the buffer memory to the page buffer and program the first multi-level memory cells with the first page data, the second page data, and the third page data loaded in the page buffer using a second sequence of the program operation, and then
load the first page data, the second page data and the third page data stored in the buffer memory to the page buffer again and program the first multi-bit memory cells with the first page data, the second page data, and the third page data loaded in the page buffer using a third sequence of the program operation,
wherein respective threshold voltage distributions for the first memory cells are narrowed between the first and second sequences of the program operation of the first multi-bit memory cells except for a threshold voltage distribution of an erase state, and
wherein the respective threshold voltage distributions for the first multi-bit memory cells are further narrowed between the second and third sequences of the program operation of the first memory cells except for the threshold voltage distribution of the erase state.

6. The data storage system of claim 5, wherein the controller is configured not to read out data stored in the first multi-level memory cells until the third sequence of the program operation for the first multi-level memory cells is completed.

7. The data storage system of claim 5, wherein first and second word lines are directly adjacent each other.

8. A data storage system comprising:
a non-volatile memory including a memory cell array divided into a first region and a second region and a page buffer including first through fourth latches; and
a controller configured to sequentially send a first read command, a first dump command, a second read command, a second dump command and a third read command,
wherein the non-volatile memory is configured to
read first data from a first memory cell connected to a first word line in the first region and store the first data read from the first memory cell into the first latch in response to the first read command, then
dump the first data stored in the first latch to the second latch in response to the first dump command, then
read second data from a second memory cell connected to a second word line in the first region and store the second data read from the second memory cell into the first latch in response to the second read command, then dump the second data stored in the first latch to the third latch in response to the second dump command, and then read third data from a third memory cell connected to a third word line in the first region and store the third data read from the third memory cell into the first latch in response to the third read command, wherein after the third data are stored in the first latch, the third data are dumped to the fourth latch from the first latch, and then a fourth multi-level memory cell connected to a fourth word line in the second region is programmed with the first, second and third data stored in the second, third and fourth latches.

9. The storage system of claim 8, wherein the fourth multi-level memory cell is pre-programmed before the controller send the first read command, the first dump command, the second read command, the second dump command and the third read command, and the fourth multi-level memory cell is reprogrammed with the first, second and third data stored in the second, third and fourth latches.

10. A data storage system comprising:

a non-volatile memory including a memory cell array; and a controller configured to transfer first page data and second page data, which correspond to continuous page addresses of the non-volatile memory, to the non-volatile memory, wherein the non-volatile memory is configured to program the first page data and the second page data to same memory cells connected to a same word line concurrently.

* * * * *